United States Patent
Kim et al.

(10) Patent No.: US 7,718,538 B2
(45) Date of Patent: May 18, 2010

(54) PULSED-PLASMA SYSTEM WITH PULSED SAMPLE BIAS FOR ETCHING SEMICONDUCTOR SUBSTRATES

(75) Inventors: Tae Won Kim, San Jose, CA (US); Kyeong-Tae Lee, San Jose, CA (US); Alexander Paterson, San Jose, CA (US); Valentin N. Todorov, Palo Alto, CA (US); Shashank C. Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 11/677,472

(22) Filed: Feb. 21, 2007

(65) Prior Publication Data

US 2008/0197110 A1 Aug. 21, 2008

(51) Int. Cl.
 *H01L 21/302* (2006.01)
(52) U.S. Cl. .................. 438/714; 438/706; 438/710; 216/58
(58) Field of Classification Search .......... 438/706, 438/710, 712, 714, 720, 8, 9, 725, 738; 216/58, 216/59
 See application file for complete search history.

(56) References Cited

U.S. PATENT DOCUMENTS

| | | | |
|---|---|---|---|
| 4,935,661 A | 6/1990 | Heinecke et al. | |
| 5,770,097 A | 6/1998 | O'Neill et al. | |
| 5,877,407 A | 3/1999 | Cadet et al. | |
| 6,187,685 B1 | 2/2001 | Hopkins et al. | |
| 6,228,241 B1 | 5/2001 | Alwitt et al. | |
| 6,255,221 B1* | 7/2001 | Hudson et al. | 438/710 |
| 6,332,425 B1* | 12/2001 | Kofuji et al. | 118/723 MA |
| 6,793,832 B1 | 9/2004 | Saito et al. | |
| 6,902,683 B1 | 6/2005 | Kaji et al. | |
| 2001/0051438 A1* | 12/2001 | Shin et al. | 438/706 |
| 2002/0029853 A1* | 3/2002 | Hudson et al. | 156/345 |
| 2002/0052111 A1* | 5/2002 | Paterson et al. | 438/689 |
| 2002/0139658 A1 | 10/2002 | Kanakasabapathy et al. | |
| 2003/0196757 A1 | 10/2003 | Todorow et al. | |
| 2004/0124177 A1 | 7/2004 | Urban et al. | |
| 2004/0224504 A1 | 11/2004 | Gadgil | |
| 2004/0235205 A1 | 11/2004 | Levy et al. | |
| 2005/0103620 A1 | 5/2005 | Chistyakov | |

(Continued)

OTHER PUBLICATIONS

Office Action from U.S. Appl. No. 11/678,041, mailed Oct. 10, 2008, 17 pgs.

(Continued)

*Primary Examiner*—Lan Vinh
(74) *Attorney, Agent, or Firm*—Blakely Sokoloff Taylor & Zafman, LLP

(57) ABSTRACT

A pulsed plasma system with pulsed sample bias for etching semiconductor structures is described. In one embodiment, a portion of a sample is removed by applying a pulsed plasma process, wherein the pulsed plasma process comprises a plurality of duty cycles. A negative bias is applied to the sample during the ON state of each duty cycle, while a zero bias is applied to the sample during the OFF state of each duty cycle. In another embodiment, a first portion of a sample is removed by applying a continuous plasma process. The continuous plasma process is then terminated and a second portion of the sample is removed by applying a pulsed plasma process.

9 Claims, 18 Drawing Sheets

U.S. PATENT DOCUMENTS

2005/0112891 A1* 5/2005 Johnson et al. ............. 438/691
2006/0270239 A1 11/2006 Triyoso et al.
2006/0279223 A1 12/2006 Chistyakov

OTHER PUBLICATIONS

International Search Report and Written Opinion from PCT/US 08/02368 mailed Jun. 2, 2008, 10 pgs.
International Search Report and Written Opinion from PCT/US 08/02367 mailed May 20, 2008, 11 pgs.
Office Action from U.S. Appl. No. 11/678,041, mailed Mar. 24, 2009, 13 pgs.
Office Action from U.S. Appl. No. 11/678,041, mailed Oct. 26, 2009, 7 pgs.
Non-Final Office Action for U.S. Appl. No. 11/678,047, mailed Nov. 10, 2009, 14 pgs.
PCT Search Report and Written Opinion from PCT/US08/02371 mailed Jun. 11, 2008, 10 pgs.
International Preliminary Report on Patentabiltiy and Written Opinion from PCT/US2008/002371 mailed Sep. 3, 2009, 7 pgs.
International Preliminary Report on Patentability and Written Opinion from PCT/US2008/002367 mailed Sep. 3, 2009, 7 pgs.
International Preliminary Report on Patentability from PCT/US2008/002368 mailed Sep. 3, 2009, 6 pgs.
Samukawa, Seiji, et al. "Pulse-Time Modulated Electron Cyclotron Resonance Plasma Discharge for Highly Selective, Highly Anisotropic, and Charge-Free Etching," Journal of Vacuum Science and Technology A, Nov./Dec. 1996, pp. 3049-3058, 14(6).

* cited by examiner

PLASMA ON

PLASMA OFF

PLASMA ON: BIAS OFF

PLASMA ON: BIAS ON

PLASMA OFF: BIAS ON

PLASMA OFF: BIAS OFF

US 7,718,538 B2

PULSED-PLASMA SYSTEM WITH PULSED SAMPLE BIAS FOR ETCHING SEMICONDUCTOR SUBSTRATES

BACKGROUND OF THE INVENTION

1) Field of the Invention

The invention is in the fields of Semiconductor Structures and Semiconductor Equipment.

2) Description of Related Art

For the past several years, the performance and capabilities of integrated circuits (ICs), e.g. logic circuits for computation and memory circuits for information storage, have been greatly enhanced by scaling the features of semiconductor structures to ever smaller dimensions. However, it is seldom the case that the equipment and processes used to fabricate ICs scale without issue. Continued advances in both semiconductor process technologies as well as in the equipment used to carry out such processes has ensured survival of the relentless pursuit of scaling by the Semiconductor Industry.

In order to pattern semiconductor stacks into meaningful structures, a lithography/etch process is typically employed. State-of-the-art etch processes include etching a semiconductor stack with a system comprising an ionized gas, i.e. a plasma. Plasma etch processing may be particularly useful for etching multiple adjacent structures with fine features. However, as demands on feature size and spacing become more stringent, limitations of the plasma etch process have revealed themselves.

One potential limitation of plasma etching may be with respect to the fabrication of an IC with variable spacing between various semiconductor structures within a single sample. For example, the etch rate may exhibit a dependence on pattern density, a phenomenon referred to as "micro-loading." At very small dimensions, and particularly in high aspect ratio regimes, the etch rate of a material that has been patterned with a high density (i.e. smaller spacings between features) may be slower than the etch rate of the same material patterned with a low density (i.e. larger spacings between features). Thus an "over-etch" may be required to fully etch all of the various structures within a single sample, i.e. the areas that are first to completely etch continue to be exposed to the etch process while areas that have not completely etched undergo completion of the etch process. In some cases, this over-etch may have a detrimental impact on the resultant semiconductor structures.

Referring to FIG. 1, a plot is provided correlating the etch rate of a particular semiconductor material with the density (i.e. spacings between features) of various semiconductor structures in a single sample in which micro-loading occurs. As indicated by the decreasing slope of the correlation line, the etch rate decreases with increasing density. Referring to FIG. 2A, a semiconductor stack 200 comprises a substrate 202, a semiconductor layer 204 and a mask 206. Referring to FIG. 2B, the pattern of mask 206 is etched into semiconductor layer 204 with a plasma etch process. Micro-loading can occur during the etch process of semiconductor stack 200, such that semiconductor layer 204 etches faster in low density region 208 than in medium density region 210 and high density region 212, as depicted in FIG. 2B. Referring to FIG. 2C, the etch process performed on semiconductor stack 200 is completed in low density region 208 prior to completion in medium density region 210 and in high density region 212. Thus, the structures in low density region 208 are exposed to an over-etch while the etch is completed in regions of higher density. Referring to FIG. 2D, during the over-etch, some detrimental undercutting 214 may occur on structures in regions of lower density. The undercutting may vary with the density, depending on the extent of over-etch that a particular region experiences, as depicted in FIG. 2D.

Thus, a method for etching semiconductor structures is described herein, along with a system within which the method may be conducted.

DETAILED DESCRIPTION

A method and a system for etching semiconductor structures are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein are a pulsed plasma method and a corresponding system for etching semiconductor structures. A portion of a sample may be removed by applying a pulsed plasma process, wherein the pulsed plasma process comprises a plurality of duty cycles. In accordance with an embodiment of the present invention, a negative bias is applied to the sample during the ON state of each duty cycle, while a zero bias is applied to the sample during the OFF state of each duty cycle. In a specific embodiment, a first portion of a sample is removed by applying a continuous plasma process. The continuous plasma process is then terminated and a second portion of the sample is removed by applying a pulsed plasma process with pulsed sample bias.

Figure 1:
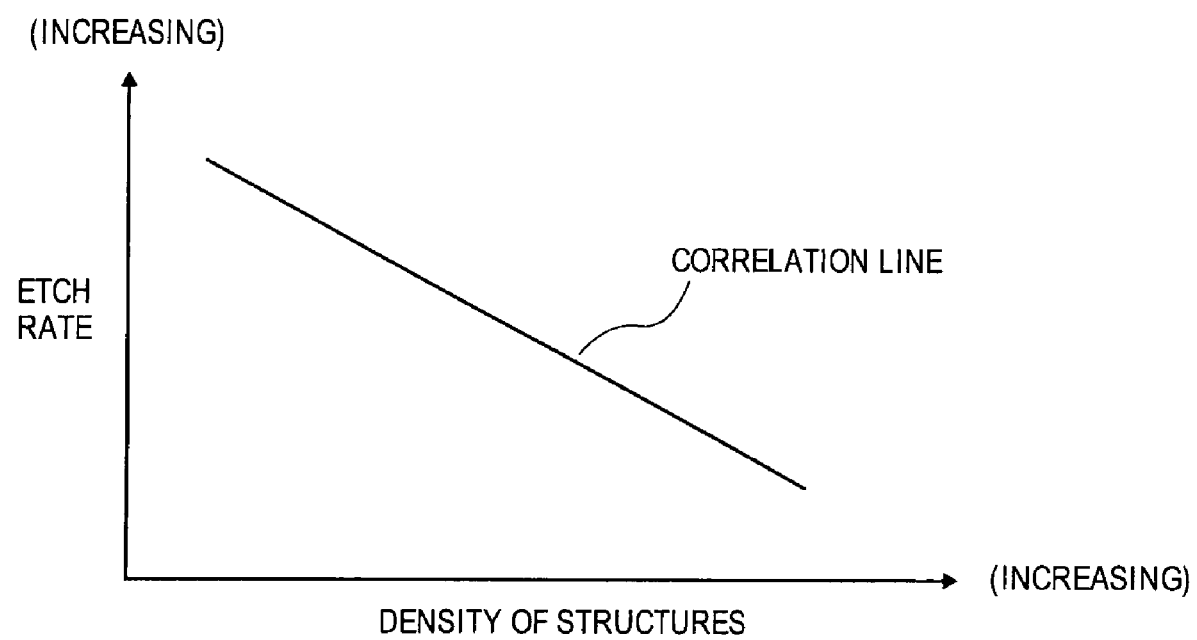
FIG. 1 illustrates a correlation plot of Etch Rate versus Density of Structures, in accordance with the prior art.
Figure 2A:
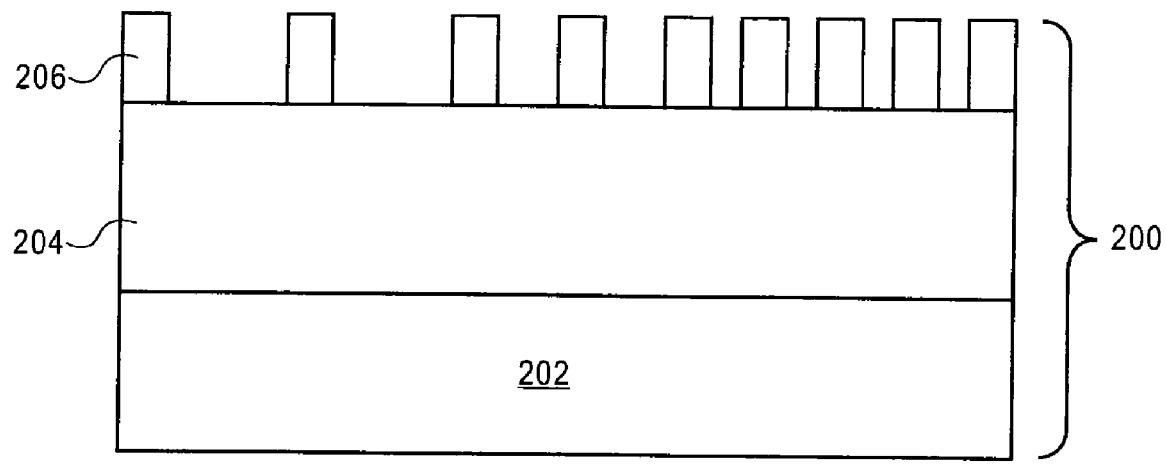
FIGS. 2A-D illustrate cross-sectional views representing the effects of micro-loading during an etch process conducted on a semiconductor stack, in accordance with the prior art.
Figure 2B:
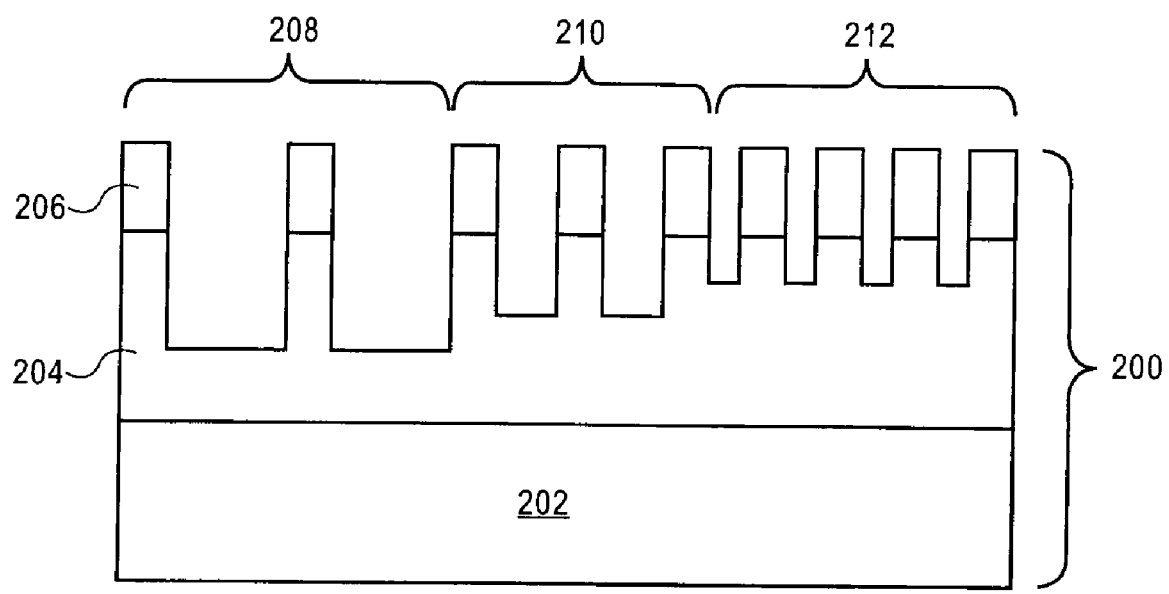
Figure 2C:
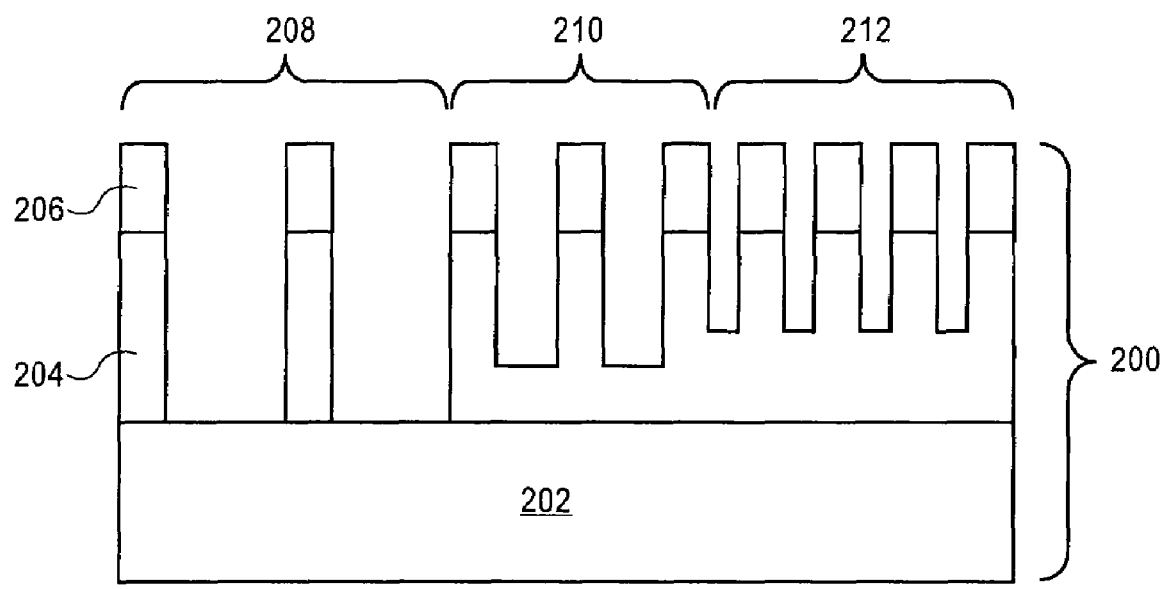
Figure 2D:
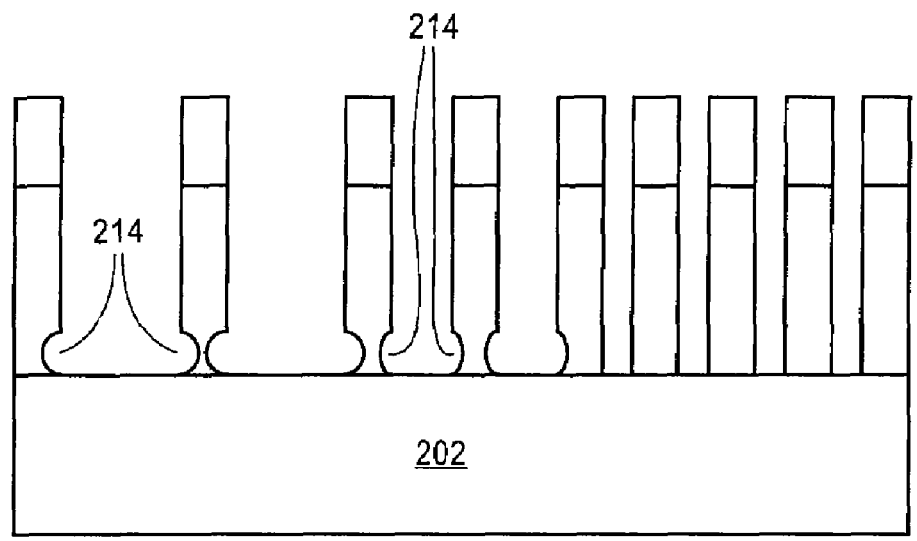
Figure 3:
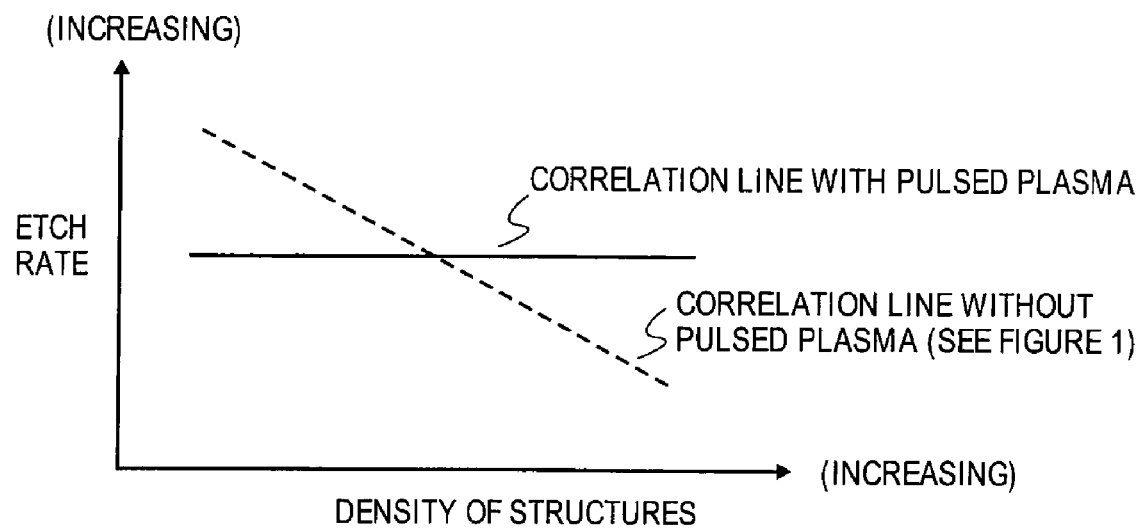
FIG. 3 illustrates a correlation plot of Etch Rate versus Density of Structures, in accordance with an embodiment of the present invention.

By repeatedly pulsing a plasma during an etch process, the etch rate dependency on structure density may be mitigated. During an ON state of a plasma (i.e. when the plasma is in the form of an ionized gas), and hence during the primary etching phase of a semiconductor material in a plasma etch process, etch by-products are formed. As the etch process progresses in regions of higher density, these by-products may migrate away from the sample at a rate slower than in lower density regions of the sample. Thus, in a continuous ON state, etch by-products may hinder the etch process lending to micro-loading. In the OFF state, however, these by-products may be removed from all regions without competing with the etch process. The application of a plurality of duty cycles (i.e. cycles of ON/OFF states) may be performed in order to etch a semiconductor material with substantially the same etch rate over an entire sample, regardless of structure density. FIG. 3 illustrates a correlation plot of Etch Rate versus Density of Structures in a pulsed plasma etch process, in accordance with an embodiment of the present invention. As indicated by the negligible slope of the correlation line, the etch rate is substantially the same with increasing density. A semiconductor material etched in this manner may suffer less detriment from over-etch because the etch process may be completed in all portions of the sample at substantially the same time.

During the ON state of a duty cycle in a pulsed plasma etch process, positive charge may be imparted to the sample being etched. In some instances, the positive charge of the sample may be substantial enough to partially deflect the positively charged etch species ejected from a plasma. Such deflection of the etching species may result in detrimental undercut of features being etched into a particular sample. By biasing the sample with a negative charge during the etching process, the deflection of positively charged particles may be mitigated. On the other hand, during the transition from the ON state to the OFF state of a duty cycle in a pulsed plasma etch process, the discharge of negatively-charged particles from the plasma may be inhibited if the sample is negatively biased. By zero-biasing the sample during the OFF state of a duty cycle, and thus not repelling negatively-charged particles emitted as the plasma discharges, a reduced time for plasma discharge may be achieved. Additionally, the negatively charged species may contribute to, and thus enhance, the etching process. Thus, in accordance with an embodiment of the present invention, a pulsed sample bias process is conducted parallel to the pulsed plasma process. That is, the sample is negatively biased during the ON state and is zero-biased during the OFF state of a duty cycle in a pulsed plasma etch process.

Figure 4A:
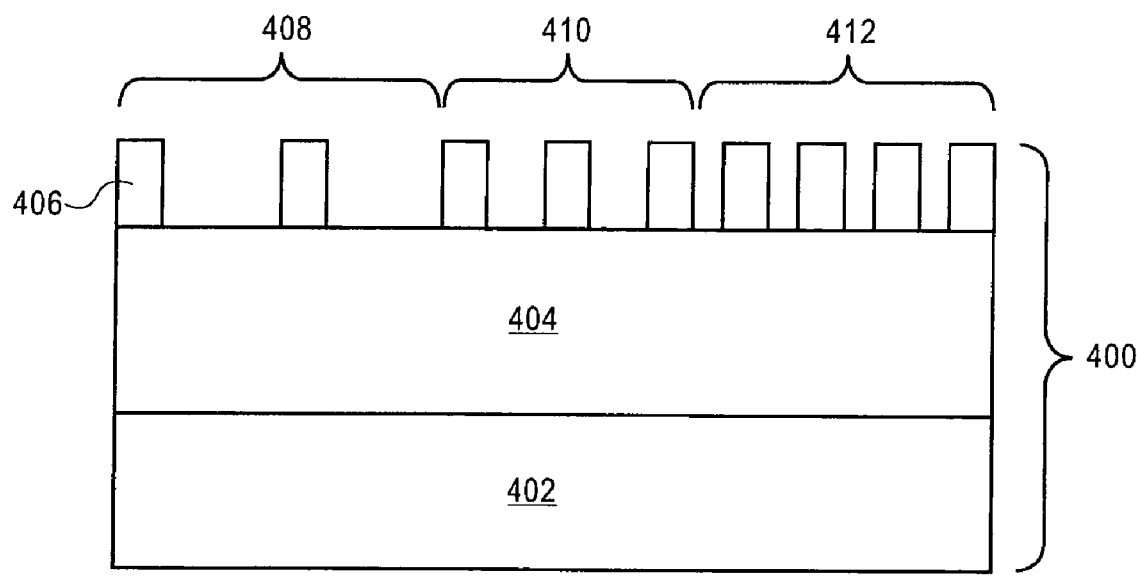
FIGS. 4A-C illustrate cross-sectional views representing the effects of a significant reduction in micro-loading during a pulsed etch process with pulsed sample bias as conducted on a semiconductor stack, in accordance with an embodiment of the present invention.
Figure 4B:
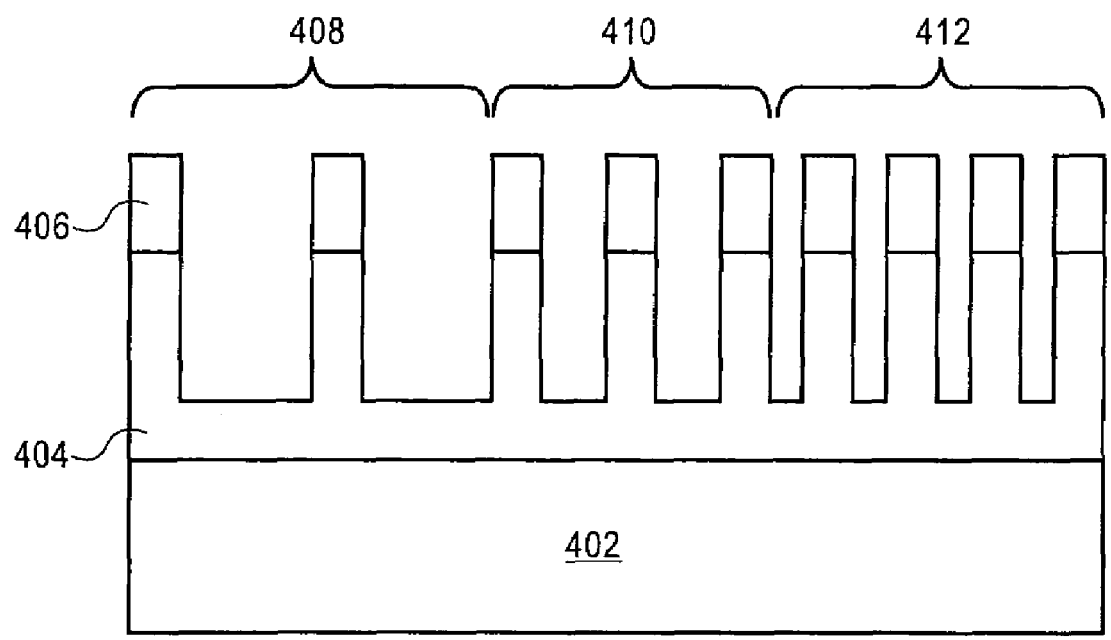
Figure 4C:
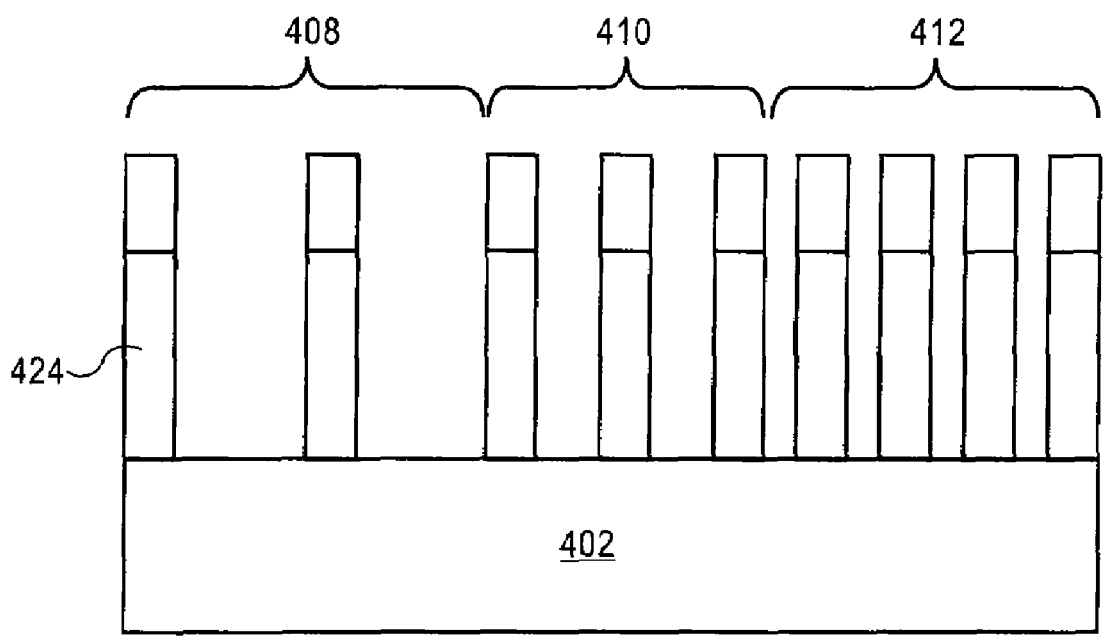

A semiconductor stack may be etched by a pulsed plasma etch process with pulsed sample bias. FIGS. 4A-C illustrate cross-sectional views representing the effects of a significant reduction in micro-loading during a pulsed etch process with pulsed sample bias conducted on a semiconductor stack, in accordance with an embodiment of the present invention.

Referring to FIG. 4A, a semiconductor stack 400 comprises a substrate 402, an etch layer 404 and a mask 406. Mask 406 is patterned with a low density region 408, a medium density region 410 and a high density region 412. Semiconductor stack 400 may comprise a stack of greater complexity of material layers and/or pattern types, but is depicted in the manner shown herein for illustrative purposes.

Substrate 402 may comprise any material that can withstand a manufacturing process and upon which semiconductor layers may suitably reside. In an embodiment, substrate 402 is comprised of group IV-based materials such as crystalline silicon, germanium or silicon/germanium. In one embodiment, the atomic concentration of silicon atoms in substrate 402 is greater than 99%. In another embodiment, substrate 402 is comprised of a III-V material such as, but not limited to, gallium nitride, gallium phosphide, gallium arsenide, indium phosphide, indium antimonide, indium gallium arsenide, aluminum gallium arsenide, indium gallium phosphide or a combination thereof. In an alternative embodiment, substrate 402 is comprised of an epitaxial layer grown atop a distinct crystalline substrate, e.g. a silicon epitaxial layer grown atop a boron-doped bulk silicon mono-crystalline substrate. Substrate 402 may also comprise an insulating layer in between a bulk crystal substrate and an epitaxial layer to form, for example, a silicon-on-insulator substrate. In one embodiment, the insulating layer is comprised of a material selected from the group consisting of silicon dioxide, silicon nitride, silicon oxy-nitride and a high-k dielectric layer. In another embodiment, substrate 402 comprises a top insulating layer, directly adjacent to etch layer 404.

Substrate 402 may additionally comprise charge-carrier dopant impurity atoms. For example, in accordance with an embodiment of the present invention, substrate 402 is comprised of silicon and/or germanium and the charge-carrier dopant impurity atoms are selected from the group consisting of boron, arsenic, indium, antimony or phosphorus. In another embodiment, substrate 402 is comprised of a III-V material and the charge-carrier dopant impurity atoms are selected from the group consisting of carbon, silicon, germanium, oxygen, sulfur, selenium or tellurium.

Etch layer 404 may comprise any material that can be suitably patterned into an array of distinctly defined semiconductor structures. In accordance with an embodiment of the present invention, etch layer 404 is comprised of a group IV-based material or a III-V material, such as those discussed above in association with substrate 402. Additionally, etch layer 404 may comprise any morphology that can suitably be patterned into an array of distinctly defined semiconductor structures. In an embodiment, the morphology of etch layer 404 is selected from the group consisting of amorphous, single-crystalline and poly-crystalline. In one embodiment, etch layer 404 comprises charge-carrier dopant impurity atoms, such as those described above in association with substrate 402.

The composition of etch layer 404 need not be limited to semiconductor materials, per se. In accordance with an alternative embodiment of the present invention, etch layer 404 is comprised of a metal layer such as but not limited to copper, aluminum, tungsten, metal nitrides, metal carbides, metal silicides, hafnium, zirconium, titanium, tantalum, aluminum, ruthenium, palladium, platinum, cobalt, nickel or conductive metal oxides, e.g. ruthenium oxide. In yet another embodiment of the present invention, etch layer 404 is comprised of an insulating layer. In one embodiment, etch layer 404 is comprised of an insulating material selected from the group consisting of silicon dioxide, silicon oxy-nitride and silicon nitride. In another embodiment, etch layer 404 is comprised of a high-K dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide and lead zinc niobate.

Mask 406 may be comprised of any material suitable for patterning via a lithography or direct-write process. In one embodiment, mask 406 is comprised of a photo-resist material. In a specific embodiment, the photo-resist material is used in a lithographic process and is selected from the group consisting of a positive photo-resist and a negative photo-resist. Mask 406 may further comprise a material suitable for blocking a plasma etch process, such as a plasma etch process used to pattern etch layer 404. Thus, in accordance with another embodiment of the present invention, mask 406 also comprises a hard-mask layer, such as a hard-mask layer selected from the group consisting of silicon dioxide, silicon oxy-nitride, silicon nitride and a metal film.

Referring to FIG. 4B, the pattern of mask 406 is etched into etch layer 404 with a pulsed plasma etch process having pulsed sample bias to form partially patterned etch layer 414. Under the appropriate conditions, and in accordance with an embodiment of the present invention, the etch rate of all density regions 408, 410 and 412 are substantially similar when a pulsed plasma process with pulsed sample bias is employed, as depicted in FIG. 4B. The pulsed plasma process with pulsed sample bias contains a plurality of duty cycles, wherein each duty cycle represents the combination of an ON state and an OFF state of the etching plasma. A negative bias is applied to the sample during the ON state of the duty cycle, while a zero bias is applied to the sample during the OFF state of the duty cycle. A duty cycle may be comprised of one ON state and one OFF state, wherein the durations of the ON state and OFF state are suitable to transfer the pattern of mask 406 into etch layer 404 at a substantially similar etch rate for density regions 408, 410 and 412. In accordance with an embodiment of the present invention, the portion of each duty cycle comprised of said ON state is in the range of 5-95% of the duty cycle. In a specific embodiment, the portion of each duty cycle comprised of said ON state is in the range of 65-75% of the duty cycle. In another embodiment, the frequency of a plurality of duty cycles is in the range of 1 Hz-200 kHz, i.e. each duty cycle has a duration in the range of 5 micro-seconds-1 second. In a specific embodiment, the frequency of a plurality of duty cycles is 50 kHz and the portion of each duty cycle comprised of said ON state is 70%. The negative bias applied to semiconductor stack 400 during the ON state of a duty cycle should be sufficient to mitigate the deflection of positively-charged etch species emitted from the plasma. In accordance with an embodiment of the present invention, the negative bias applied to semiconductor stack 400 during the ON state of a duty cycle is in the range of 5-1000 Watts. In a specific embodiment, the negative bias applied to semiconductor stack 400 during the ON state of a duty cycle is in the range of 100-200 Watts.

The method of generating a plasma for use in the pulsed plasma process with pulsed sample bias for etching etch layer 404 may comprise any method suitable to strike and maintain the plasma for a duration sufficient to satisfy the duration of the ON state in a duty cycle. For example, in accordance with an embodiment of the present invention, the method of generating the plasma comprises generating a plasma selected from the group consisting of an electron cyclotron resonance (ECS) plasma, a helicon wave plasma, an inductively coupled plasma (ICP) and a surface wave plasma. In a specific embodiment, the method of generating the plasma comprises generating an inductively coupled plasma in an Applied Materials™ AdvantEdge G3 etcher.

The plasma generated for the pulsed plasma etch process with pulsed sample bias may be comprised of any reaction gas suitable to generate ions and reactive radicals to remove portions of etch layer 404 without detrimentally impacting the pattern of mask 406. For example, in accordance with an embodiment of the present invention, the reaction gas is comprised of a halide species and is used to etch a silicon-based material. In a specific embodiment, the reaction gas is comprised of the species HBr, He and a 70%/30% He/O$_2$ mixture in the approximate ratio of 300:50:12, respectively, and the pulsed plasma is used to etch amorphous silicon, poly-silicon or single-crystal silicon. In another embodiment, the reaction gas is comprised of a fluorocarbon species and is used to etch a dielectric layer. In a specific embodiment, the reaction gas is comprised of the species CF$_4$ and the pulsed plasma is used to etch silicon dioxide or carbon-doped silicon oxide. The reaction gas may have a pressure suitable to provide a controlled etch rate. In an embodiment, the pressure is in the range of 1-100 mTorr. In another embodiment, the pressure is in the range of 3-100 mTorr. In a specific embodiment, the reaction gas is comprised of HBr, He and O$_2$, the pressure of the reaction gas is in the range of 30-50 mTorr and the etch rate of poly-silicon is in the range of 500-6000 Angstroms/minute.

Referring to FIG. 4C, the pulsed plasma process with pulsed sample bias described above is continued until partially patterned etch layer 414 becomes patterned etch layer 424. By using the pulsed plasma etch process with pulsed sample bias described above through to completion of the etching of etch layer 404, the etch process is completed at density regions 408, 410 and 412 at substantially the same time. Thus, only a negligible amount of over-etching may be required in order to form patterned etch layer 424. As such, detrimental undercutting of the various structures of patterned etch layer 424 may be significantly mitigated, as depicted by the lack of undercut in FIG. 4C.

Figure 5A:
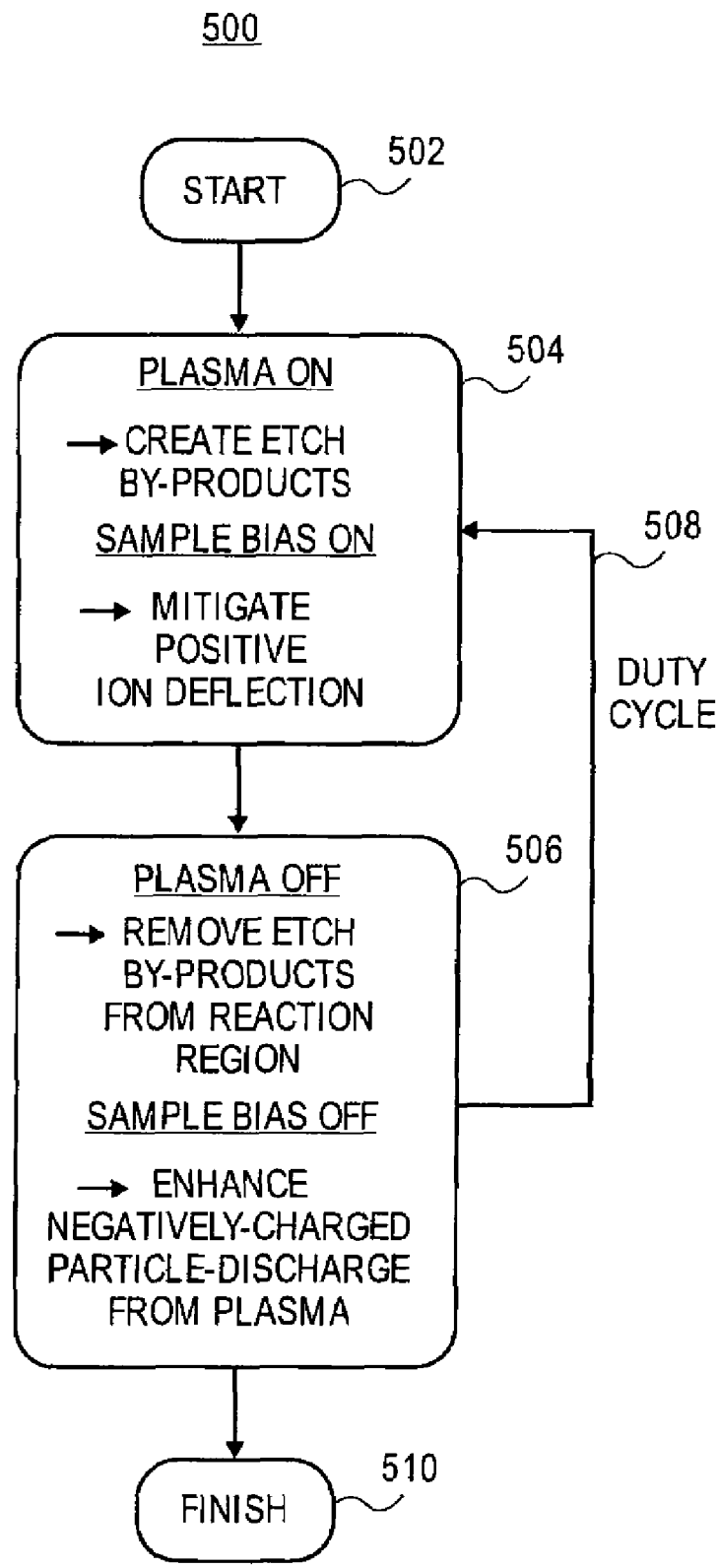
FIG. 5A is a flowchart and FIG. 5B is a waveform, both representing a series of steps in a pulsed plasma process with pulsed sample bias, in accordance with an embodiment of the present invention.

The duration of the ON state and the OFF state in a duty cycle of a pulsed plasma etch process with pulsed sample bias may be targeted to correspond with the formation and removal of etch by-products. FIG. 5A is a flowchart and Figure B is a waveform, both representing a series of such targeted steps in a pulsed plasma process with pulsed sample bias, in accordance with an embodiment of the present invention. FIGS. 6A-D illustrate cross-sectional views representing the steps of the flowchart from FIG. 5A as performed on a semiconductor stack.

Figure 6A:
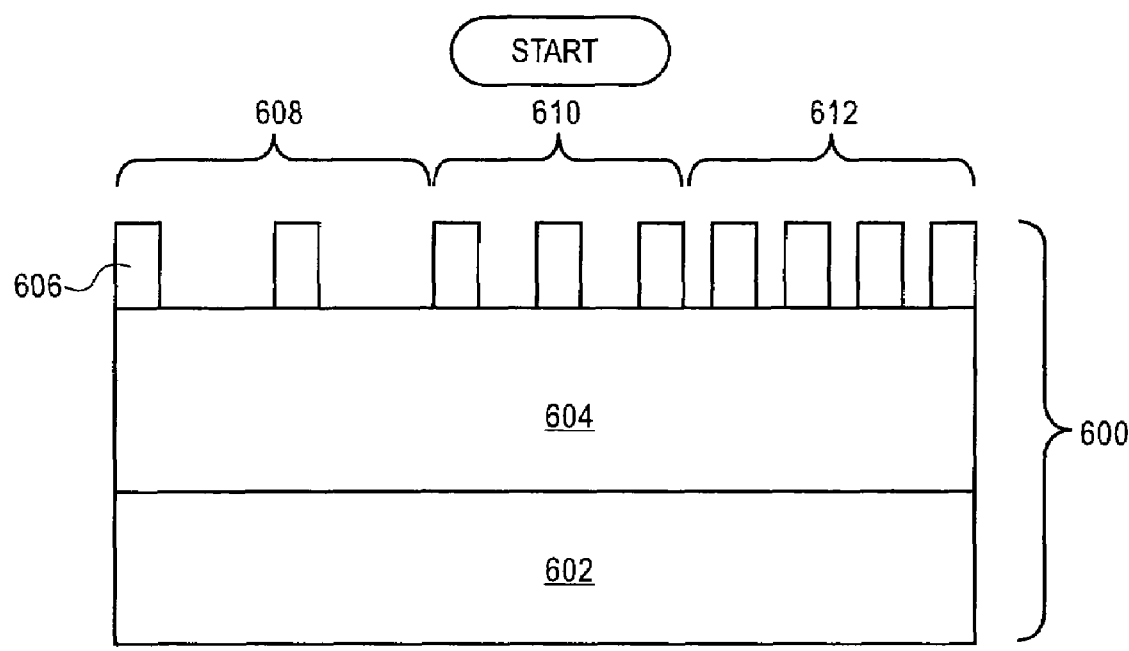
FIGS. 6A-F illustrate cross-sectional views representing the steps of the flowchart from FIG. 5A performed on a semiconductor stack, in accordance with an embodiment of the present invention.

Referring to step 502 of flowchart 500 and corresponding FIG. 6A, a semiconductor stack 600 comprises a substrate 602, an etch layer 604 and a mask 606 at the start of a pulsed plasma etching process having pulsed sample bias. Mask 606 is patterned with a low density region 608, a medium density region 610 and a high density region 612. Substrate 602, etch layer 604 and mask 606 may be comprised of any materials described in association with substrate 402, etch layer 404 and mask 406, respectively, from FIG. 4A. Semiconductor stack 600 may comprise a stack of greater complexity of material layers and/or pattern types, but is depicted in the manner shown herein for illustrative purposes.

Figure 6B:
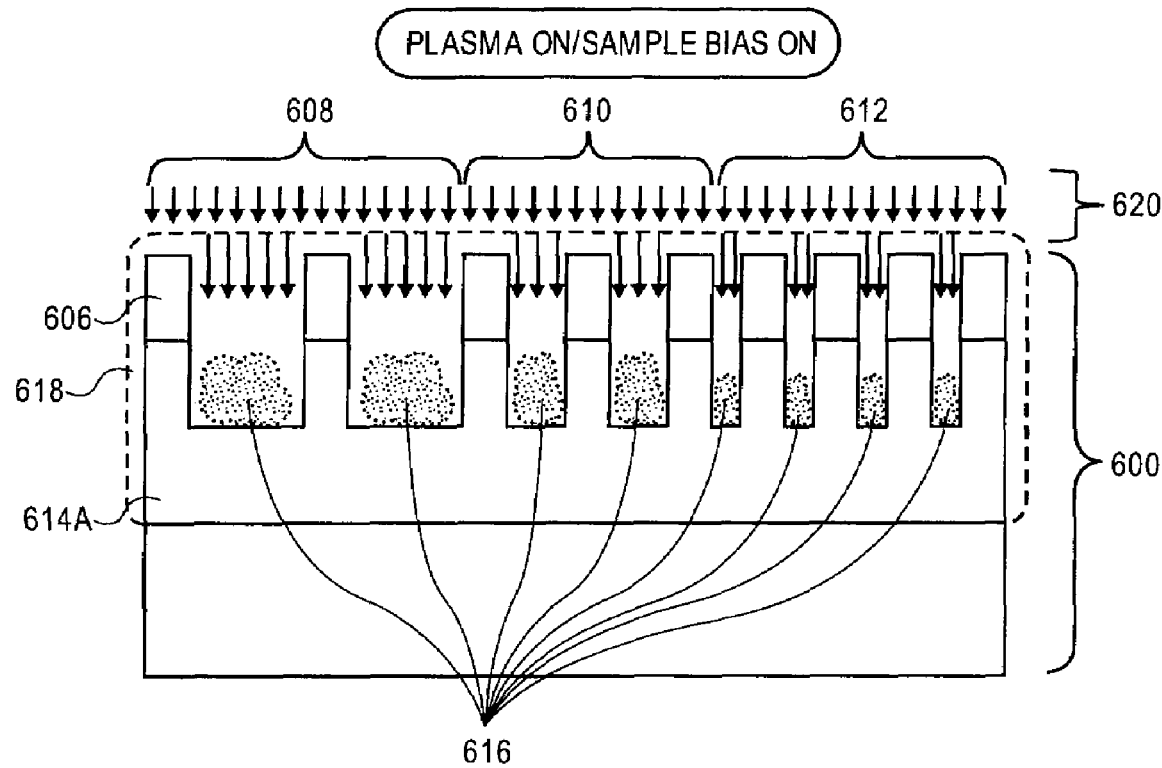

Referring to step 504 of flowchart 500 and corresponding FIG. 6B, the pattern of mask 606 is partially etched into etch layer 604 during the ON state of a duty cycle in a pulsed plasma etch process with pulsed sample bias to form partially patterned etch layer 614A. Unmasked portions of etch layer 604 are accessible by plasma etching species 620 while masked portions of etch layer 604, covered by mask 606, are protected from plasma etching species 620, as depicted in FIG. 6B. Etch by-products 616 are generated within reaction region 618 of semiconductor stack 600.

Etching species 620 may be comprised of any charged species and reactive neutrals ejected from the plasma used in a pulsed plasma etch process. For example, in accordance with an embodiment of the present invention, etching species 620 are comprised of positively charged ions and radicals. In one embodiment, the reaction gas is comprised of HBr, He and $O_2$ and the etching species 620 are selected from the group consisting of $H^+$, $Br^+$, $He^+$, $O^+$, H, Br and O. In another embodiment, the reaction gas is comprised of a fluorocarbon and the etching species 620 are selected from the group consisting of $F^+$, $CF^+$, $CF_2^+$ and $CF_3^+$, F, CF, $CF_2$ and $CF_3$. Etch by-products 616 may be comprised of any combination of atoms from semiconductor layer 604 and etching species 620. In a specific embodiment, etching species 620 are comprised of a halide cation $X^+$ and/or a halide radical X (X=F, Cl, Br), semiconductor layer 604 is comprised of silicon atoms, and etch by-products 620 are comprised of by-products selected from the group consisting of the neutral species $SiX_n$, where n is 1, 2, 3 or 4.

The duration of the ON state of a duty cycle may be selected to maximize etch efficiency while maintaining a substantially similar etch rate for all density regions 608, 610 and 612 of partially patterned etch layer 614A. As depicted in FIG. 6B, etch by-products 616 are formed and reside, at least for a time, among the partially etched features of partially patterned etch layer 614A, i.e. within reaction region 618. Reaction region 618 is a region adjacent semiconductor stack 600 within which etch by-products 616 that are formed may interfere with plasma etching species 620. That is, as the amount of etch by-products 616 increases within reaction region 618 throughout the lifetime of an ON cycle, plasma etching species 620 may be hindered from accessing unmasked portions of partially patterned etch layer 604. Such hindering of plasma etching species 620 may be more severe in high structure density regions as compared to low structure density regions, slowing the etch rate in the high density regions as compared with the etch rate of the low density regions. Thus, in accordance with an embodiment of the present invention, the ON state of a duty cycle in a pulsed plasma etch process with pulsed sample bias is selected to be less than or, at most, correspond with the time at which a sufficient amount of etch by-products are generated to slow the etch rate of a high density region versus the etch rate of a low density region. In one embodiment, the duration of the ON state is selected to substantially match the time at which the etch rate of the partially patterned etch layer 614A becomes dependent on the density of the pattern of mask 606. In another embodiment, the ON state is of a sufficiently short duration to substantially inhibit micro-loading within reaction region 618. In an embodiment, the duration of the ON state is within any of the ranges described for the ON state of the duty cycle discussed in association with FIG. 4B. The negative bias applied to semiconductor stack 600 during the ON state of a duty cycle should be sufficient to mitigate the deflection of positively-charged etch species emitted from the plasma. In accordance with an embodiment of the present invention, the negative bias applied to semiconductor stack 600 during the ON state of a duty cycle is in the range of 5-1000 Watts. In a specific embodiment, the negative bias applied to semiconductor stack 600 during the ON state of a duty cycle is in the range of 100-200 Watts.

Figure 6C:
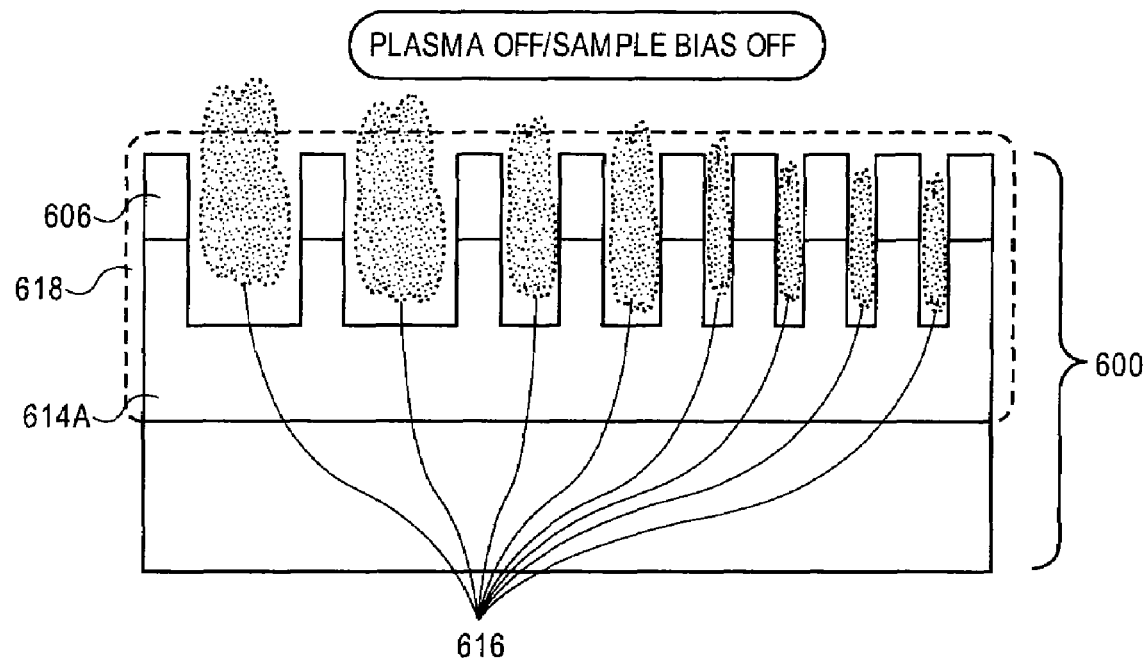

Referring to step 506 of flowchart 500 and corresponding FIG. 6C, the plasma is in an OFF state and, thus, etching species 620 are no longer present in reaction region 618 of semiconductor stack 600. As depicted in FIG. 6C, etch by-products 616 are removed from reaction region 618 and semiconductor stack 600 is zero-biased.

The duration of the OFF state of a duty cycle may be selected to allow a sufficient time for etch by-products 616 to be removed from (i.e. dissipated from or evacuated from) reaction region 618. During the ON state, etch by-products 616 are formed within reaction region 618, as described above. Additionally, during the transition from the ON state to the OFF state of the plasma, negatively charged ions may be ejected from the plasma gas as it neutralizes, generating a new set of etching species. These new etching species may further contribute to the quantity of etch by-products present in reaction region 618.

At the initiation of the OFF state of the duty cycle, the concentration of by-products 616 may be substantially greater inside reaction region 618 than outside of reaction region 618. Thus, a natural diffusion gradient may form and etch by-products 616 may diffuse outside of reaction region 618. This process may be enhanced by an additional pressure gradient. That is, along with a build-up in etch by-products 616 during the ON state, the pressure within reaction region 618 may become greater than the pressure outside of reaction region 618, enhancing the extrusion of etch by-products 616. Thus, in accordance with an embodiment of the present invention, the OFF state of a duty cycle in a pulsed plasma etch process with pulsed sample bias is selected to be of a sufficiently long duration to substantially enable removal of a set of etch by-products 616 from reaction region 618. In another embodiment, the quantity of etch by-products 616 removed is sufficient such that any etch by-products that remain within reaction region 618 do not substantially interfere with etching species during an ON state of a subsequent duty cycle. In one such embodiment, the duration of the OFF state is selected to substantially match the time at which more than 50% of the etch by-products 616 have been removed from reaction region 618. In another embodiment, the duration of the OFF state is selected to substantially match the time at which more than 75% of the etch by-products 616 have been removed from reaction region 618. In an alternative embodiment, the duration of the OFF state is within any of the ranges described for the OFF state of the duty cycle discussed in association with FIG. 4B.

Figure 5B:
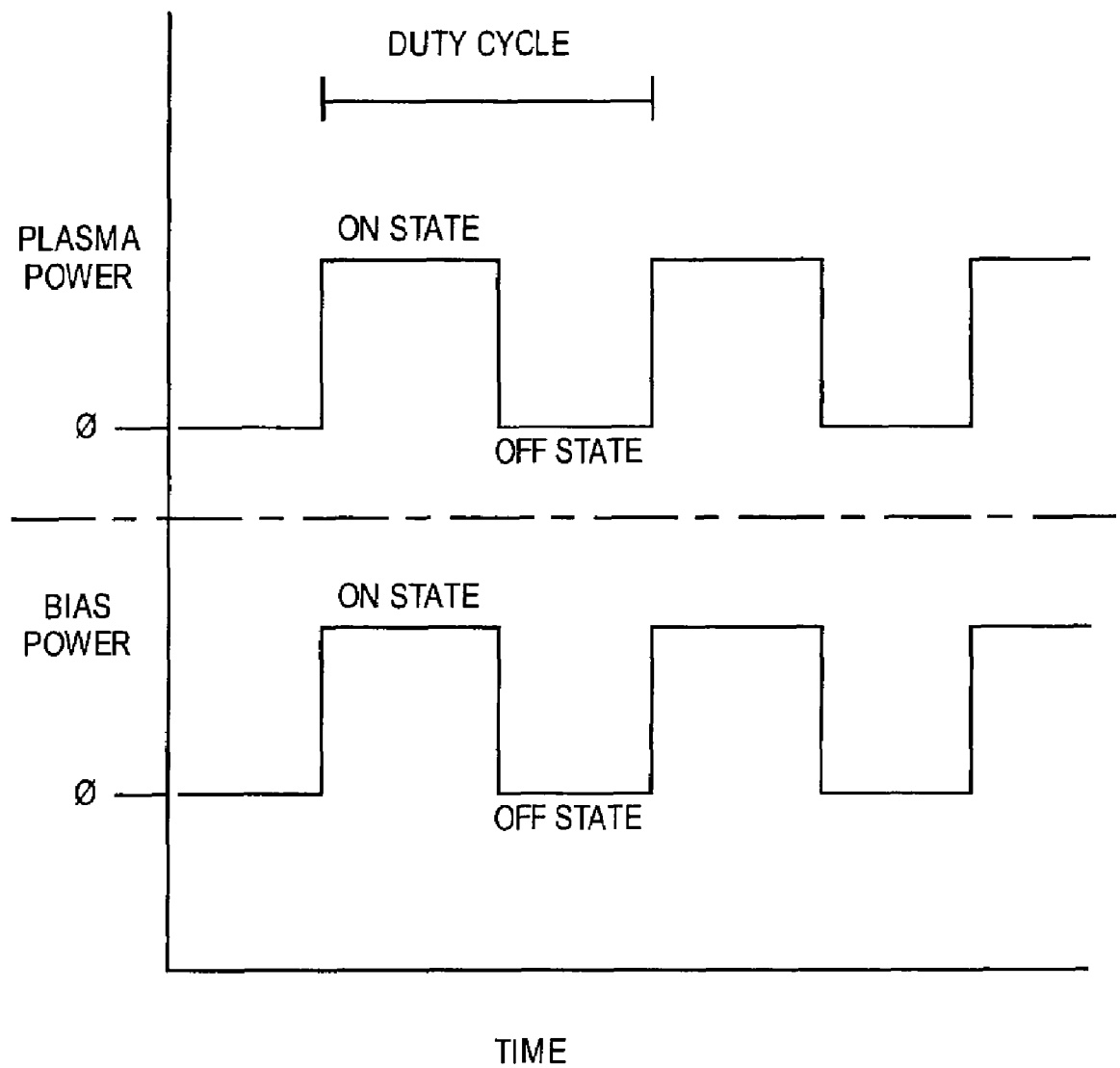
Figure 6D:
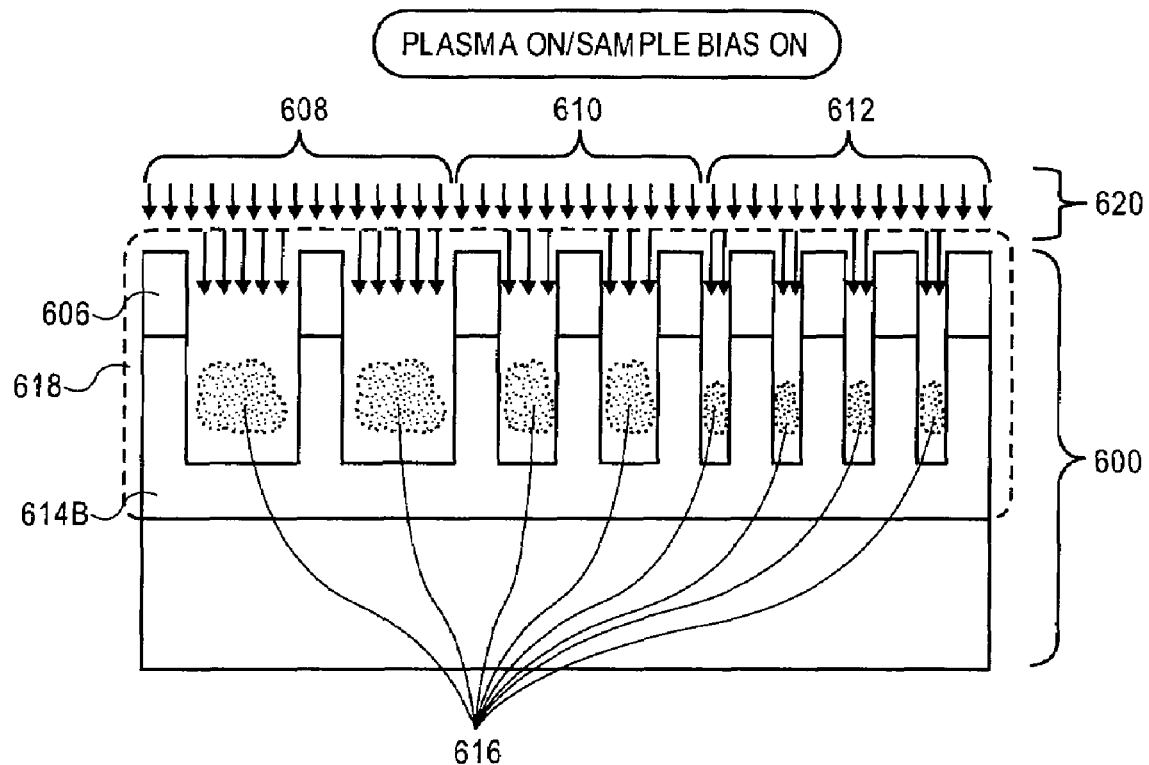
Figure 6E:
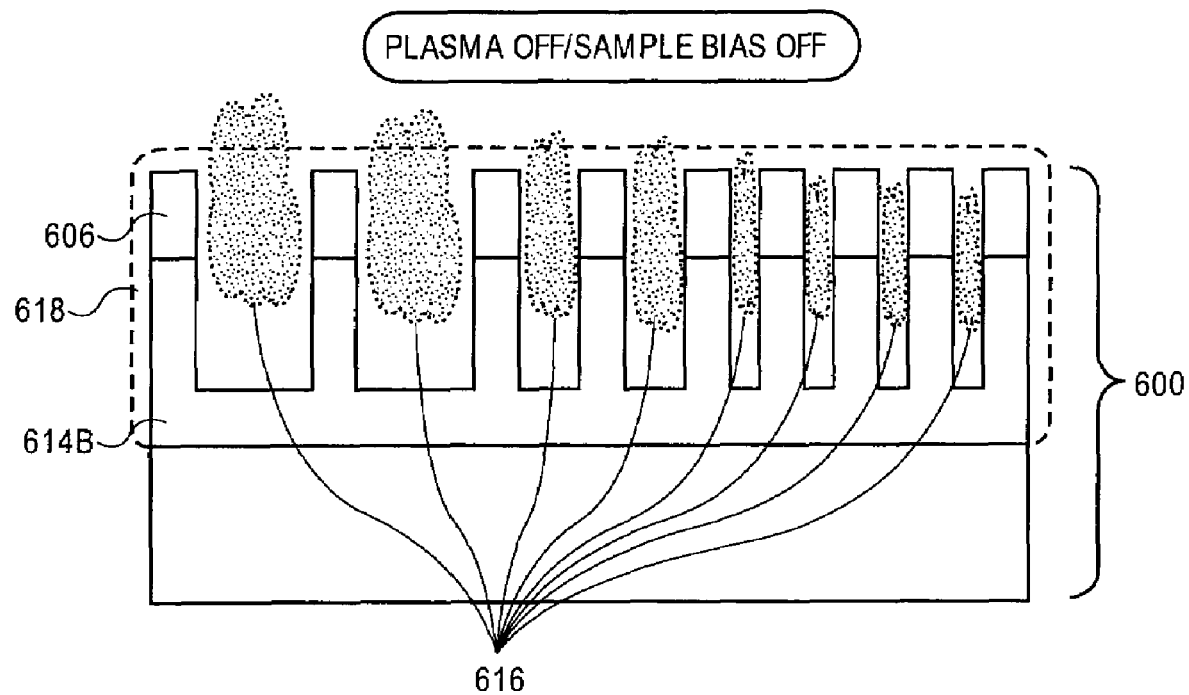

Referring to step 508 of flowchart 500 and corresponding FIGS. 6D-E, the pattern of mask 606 is continued to be etched into etch layer 604 during subsequent duty cycles of a pulsed plasma etch process with pulsed sample bias, forming more extensively etched partially patterned etch layer 614B. The duty cycles (i.e. step 508) may be repeated until a desired amount of etch layer 604 has been etched. Thus, in accordance with an embodiment of the present invention, a portion of etch layer 604 is removed with a pulsed plasma etch process comprising a plurality of duty cycles. A negative bias is applied to the sample during the ON state of the duty cycle, while a zero bias is applied to the sample during the OFF state of the duty cycle. FIG. 5B illustrates the timeline of a duty cycle, as represented in a waveform.

Figure 6F:
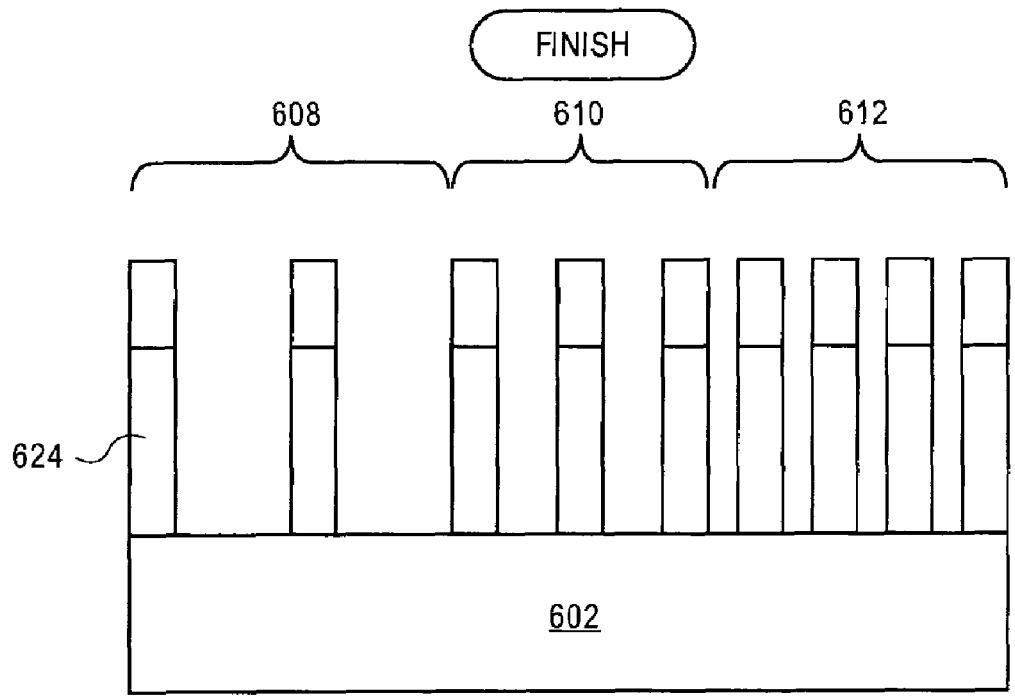

Referring to step 510 of flowchart 500 and corresponding FIG. 6F, the pulsed plasma etch process with pulsed sample bias is terminated following removal of a desired quantity of etch layer 604. By using the pulsed plasma etch process with pulsed sample bias described above through to completion of the etching of etch layer 604, the etch process is completed at density regions 608, 610 and 612 at substantially the same time. Thus, only a negligible amount of over-etching may be required in order to form patterned etch layer 624. As such, detrimental undercutting of the various structures of patterned etch layer 624 may be significantly mitigated, as depicted by the lack of undercut in FIG. 6F. The determination of when to terminate the pulsed plasma process having pulsed sample bias may be made by any suitable factor. For example, in accordance with an embodiment of the present invention, the termination of the pulsed plasma etch process with pulsed sample bias is determined by ending the repetition of duty cycles at a predetermined time. In an alternative embodiment, the termination of the pulsed plasma etch process with pulsed sample bias is determined by detecting a change in etch by-products 612 at the completion of the etching of etch layer 604 and the corresponding exposure of the top surface of substrate 602. In another embodiment, the termination of the pulsed plasma etch process with pulsed sample bias is determined by measuring the depth of a trench using an interferometric technique.

Figure 7A:
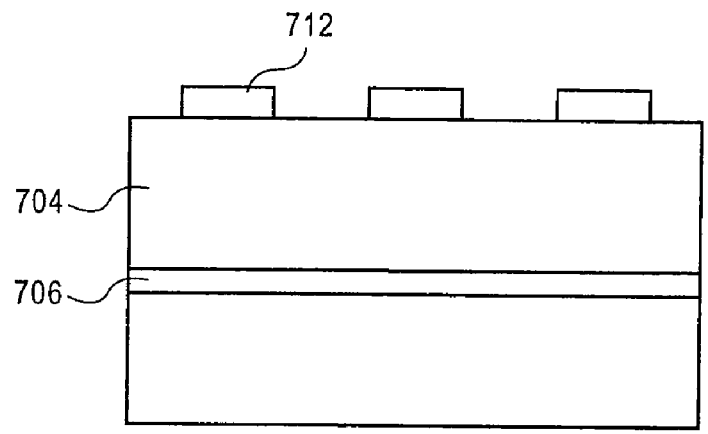
FIGS. 7A-C illustrate cross-sectional views representing a continuous/pulsed plasma etch process with pulsed sample bias performed on a semiconductor stack, in accordance with an embodiment of the present invention.
Figure 7B:
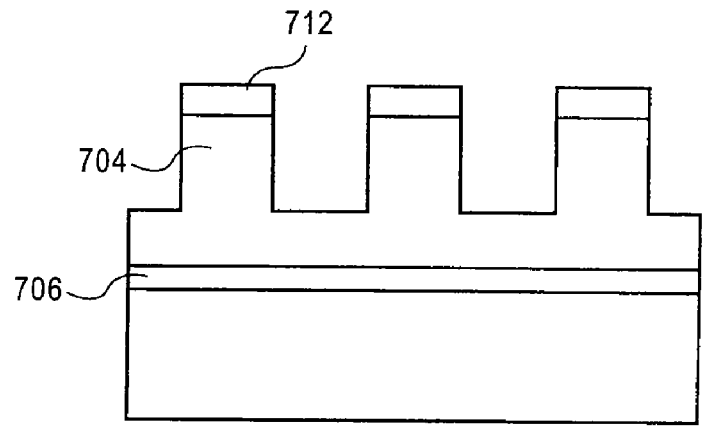
Figure 7C:
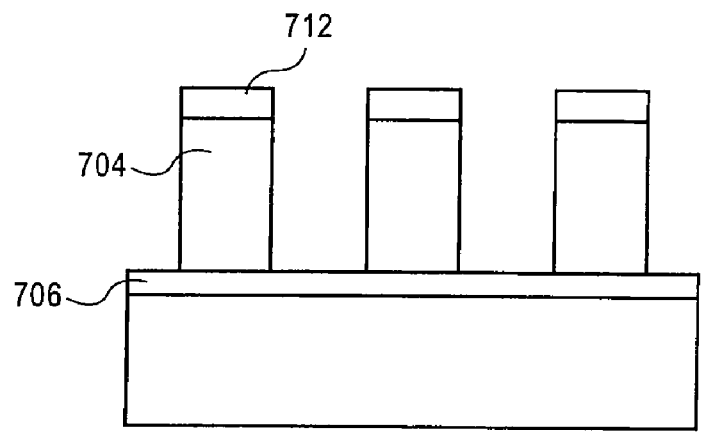

A pulsed plasma etch process with pulsed sample bias may be combined with a continuous plasma etch process. For example, it may be the case that a differential in etch rate for differing density regions of a semiconductor stack may not be significant until a portion of the semiconductor stack has already been etched, since the etch process may suffer from more severe micro-loading with increased aspect ratio of a pattern. As such, it may be more efficient to apply a continuous plasma for etching the first portion of a semiconductor stack, until a particular depth has been reached, and then to apply a pulsed plasma etch process with pulsed sample bias to remove a second portion of the semiconductor stack. In accordance with an embodiment of the present invention, a semiconductor stack is etched with a continuous plasma etch process until a desired depth has been reached. The etching of the semiconductor stack is then completed by utilizing a pulsed plasma etch process with pulsed sample bias. In one embodiment, a continuous/pulsed plasma etch process with pulsed sample bias is utilized to increase the throughput of wafers in a single-wafer processing tool. This continuous/pulsed plasma etch process with pulsed sample bias is illustrated in FIGS. 7A-C, in accordance with an embodiment of the present invention. Etch layer 704 patterned with mask 712 (FIG. 7A) is partially patterned with a continuous plasma etch process (FIG. 7B). A pulsed plasma etch process with pulsed plasma bias is subsequently employed to complete etching etch layer 704, i.e. until the etch stops on etch-stop layer 706, as depicted in FIG. 7C. In an embodiment, the depth at which the plasma etch process is changed from continuous to pulsed is selected as being in the range of 0.5-4 times the spacing width of the region of highest structure density. In one embodiment, the depth is selected as being substantially equal to the spacing width of the region of highest structure density, i.e. when an aspect ratio of 1 has been achieved among the highest density structures.

Figure 8:
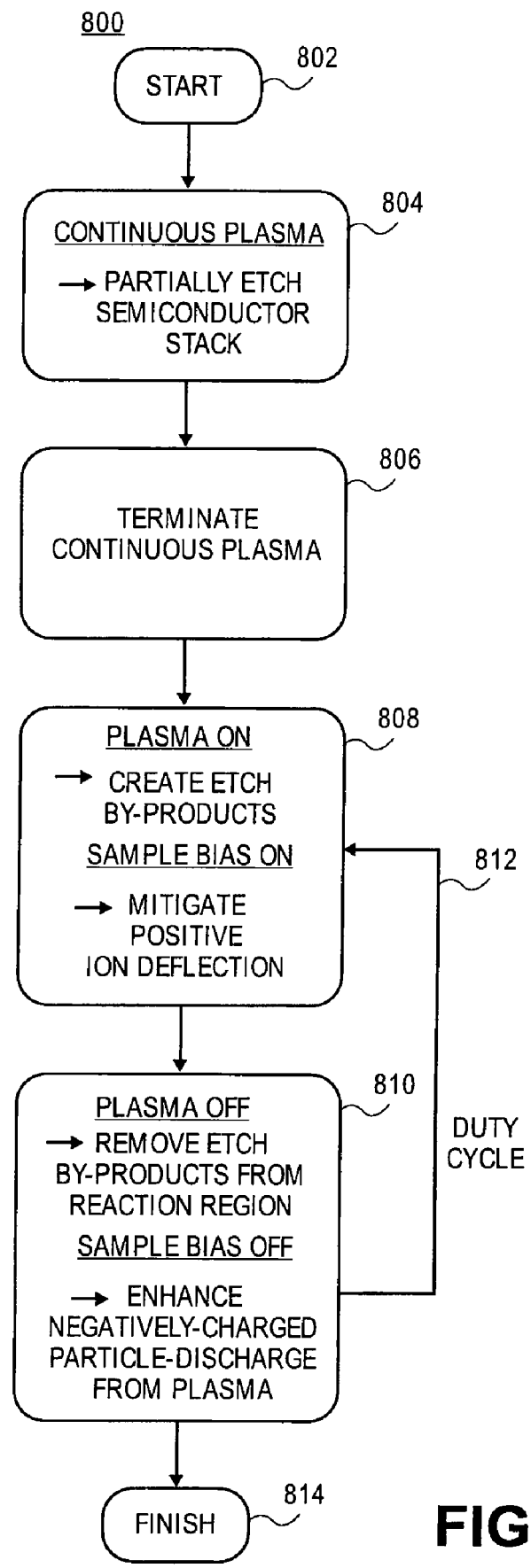
FIG. 8 is a flowchart representing a series of steps in a pulsed plasma process with pulsed sample bias, in accordance with an embodiment of the present invention.

FIG. 8 is a flowchart representing a series of steps combining a continuous plasma etch process with a subsequent pulsed plasma etch process with pulsed sample bias, in accordance with an embodiment of the present invention. FIGS. 9A-D illustrate cross-sectional views representing the steps of the flowchart from FIG. 8 as performed on a more complex semiconductor stack.

Figure 9A:
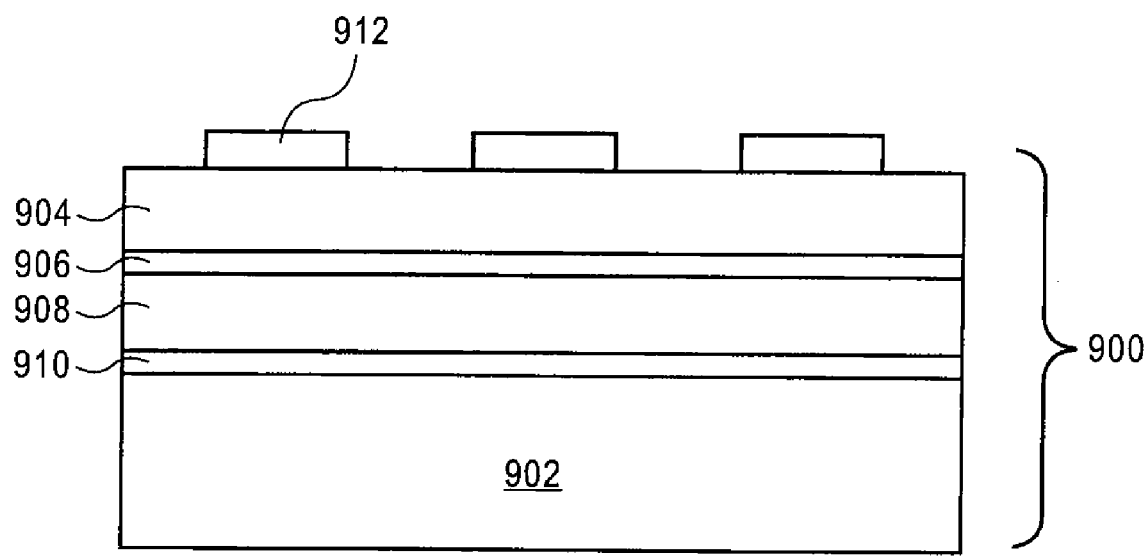
FIGS. 9A-D illustrate cross-sectional views representing the steps of the flowchart from FIG. 8 performed on a semiconductor stack, in accordance with an embodiment of the present invention.

Referring to step 802 of flowchart 800 and corresponding FIG. 9A, a semiconductor stack 900 comprises a substrate 902, two etch layers 904 and 908, two dielectric layers 906 and 910 and a mask 912 at the start of a continuous/pulsed plasma etching process. Substrate 902, etch layers 904 and 908 and mask 912 may be comprised of any materials described in association with substrate 402, etch layer 404 and mask 406, respectively, from FIG. 4A. Semiconductor stack 900 may comprise a stack of greater or lesser complexity of material layers, but is depicted in the manner shown herein for illustrative purposes. In one embodiment, semiconductor stack 900 is comprised of poly-silicon/SiON/poly-silicon/SiO$_2$, as is found in a typical Flash memory stack.

Dielectric layers 906 and 910 may be comprised of any material suitable to insulate conductive portions of a semiconductor stack. In one embodiment, dielectric layers 906 and 910 are comprised of an insulating material selected from the group consisting of silicon dioxide, silicon oxy-nitride and silicon nitride. In another embodiment, dielectric layers 906 and 910 are comprised of a high-K dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide and lead zinc niobate.

Figure 9B:
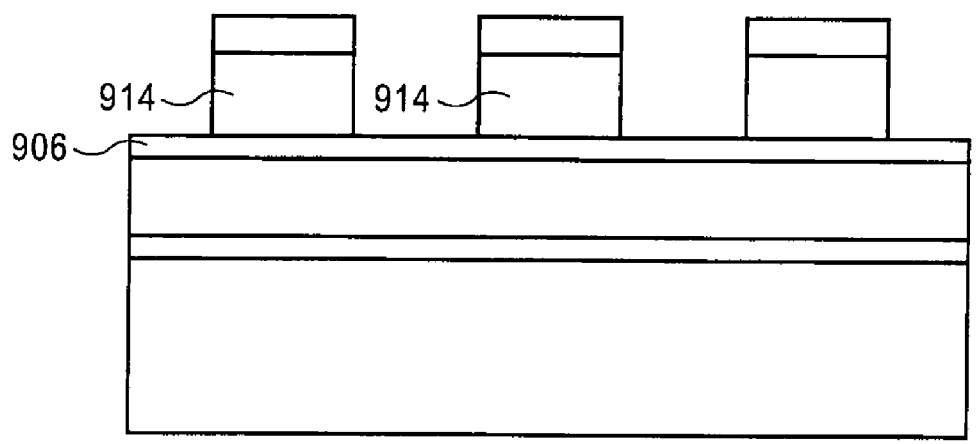

Referring to step 804 of flowchart 800 and corresponding FIG. 9B, the pattern of mask 912 is etched into etch layer 904 with a continuous plasma etch process to form patterned etch layer 914. A continuous plasma etch process may be sufficient for the etching of etch layer 904 in the case that a differential in etch rate for differing density regions of a first portion of semiconductor stack 900 is not significant. The method of generating a plasma for use in the continuous plasma process to form patterned etch layer 914 may comprise any method suitable to strike and maintain the plasma for a duration sufficient to satisfy the duration of the continuous etch process. For example, in accordance with an embodiment of the present invention, the method of generating the continuous plasma comprises generating a plasma selected from the group consisting of an electron cyclotron resonance (ECS) plasma, a helicon wave plasma, an inductive coupled plasma (ICP) and a surface wave plasma. In a specific embodiment, the method of generating the continuous plasma comprises generating an inductive coupled plasma in an Applied Materials™ AdvantEdge G3 etcher.

Figure 9C:
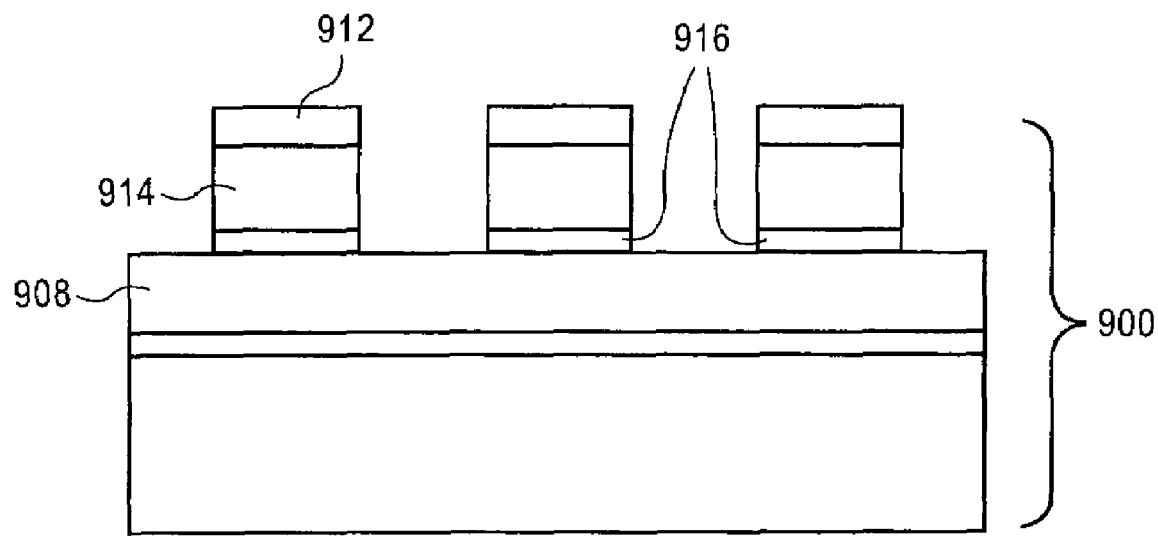

Referring to step 806 of flowchart 800 and corresponding FIG. 9B, the determination of when to terminate the continuous plasma process may be made by any suitable factor. For example, in accordance with an embodiment of the present invention, the termination of the continuous plasma etch process is determined by ending at a predetermined time based on characteristics of the material being etched. In an alternative embodiment, the termination of the continuous plasma etch process is determined by detecting a change in etch by-products at the completion of the etching of etch layer 904 and the corresponding exposure of the top surface of dielectric layer 906, i.e. by detecting an end-point. In one embodiment, the termination of the continuous plasma etch process is determined by the real-time composition of a set of chemical species generated during the continuous etch process. Referring to FIG. 9C, the exposed portions of dielectric layer 906 may be removed to form patterned dielectric layer 916 following the patterning of etch layer 904. In accordance with an embodiment of the present invention, exposed portions of dielectric layer 906 are removed by an etch process selected from the group consisting of a wet etch process, a continuous plasma etch process and a pulsed plasma etch process.

Figure 9D:

Referring to steps 808, 810 and 812 of flowchart 800 and corresponding FIGS. 9C-D, the pattern of mask 912 is continued to be etched into semiconductor stack 800. At this point, because a first portion of semiconductor stack 900 has already been etched, a differential in etch rate for differing density regions of etch layer 908 may be significant, requiring the application of a pulsed plasma etch process. Thus, in accordance with an embodiment of the present invention, a pulsed plasma etch process with pulsed sample bias is utilized to pattern etch layer 908 to form patterned etch layer 918. The duty cycles (i.e. step 712) may be repeated until a desired amount of etch layer 908 has been etched. Thus, in accordance with an embodiment of the present invention, a first portion of semiconductor stack 900 is patterned with a continuous etch plasma process and a second portion of semiconductor stack 900 is patterned with a pulsed plasma etch process comprising a plurality of duty cycles. A negative bias is applied to the sample during the ON state of the duty cycle, while a zero bias is applied to the sample during the OFF state of the duty cycle.

Referring to step 814 of flowchart 800 and corresponding FIG. 9D, the pulsed plasma etch process with pulsed sample bias is terminated following removal of a desired quantity of etch layer 908. By using the pulsed plasma etch process with pulsed sample bias described above through to completion of the etching of etch layer 908, the etch process is completed at various density regions at substantially the same time. Thus, only a negligible amount of over-etching may be required in order to form patterned etch layer 918. As such, detrimental undercutting of the various structures of patterned etch layer 918 may be significantly mitigated, as depicted by the lack of undercut in FIG. 9D. The determination of when to terminate the pulsed plasma process with pulsed sample bias may be made by any suitable factor. For example, in accordance with an embodiment of the present invention, the termination of the pulsed plasma etch process with pulsed sample bias is determined by ending the repetition of duty cycles at a predetermined time. In an alternative embodiment, the termination of the pulsed plasma etch process with pulsed sample bias is determined by detecting a change in etch by-products at the completion of the etching of etch layer 908 and the corresponding exposure of the top surface of dielectric layer 910.

The approach of combining continuous and pulsed plasma etch processes, as described above, may be applied to more complex material stacks by applying cyclic continuous/pulsed plasma etch processes. For example, in accordance with an embodiment of the present invention, a first portion of a semiconductor stack is patterned with a first continuous plasma etch process, a second portion of a semiconductor stack is patterned with a first pulsed plasma etch process having pulsed sample bias, a third portion of a semiconductor stack is patterned with a second continuous plasma etch process and a fourth portion of a semiconductor stack is patterned with a second pulsed plasma etch process having pulsed sample bias. In a specific embodiment, etch layer 904 of semiconductor stack 900 is also patterned with a first continuous plasma etch process followed by a first pulsed plasma etch process having pulsed sample bias. Etch layer 908 is then patterned with a second continuous plasma etch process followed by a second pulsed plasma etch process having pulsed sample bias.

Figure 10:
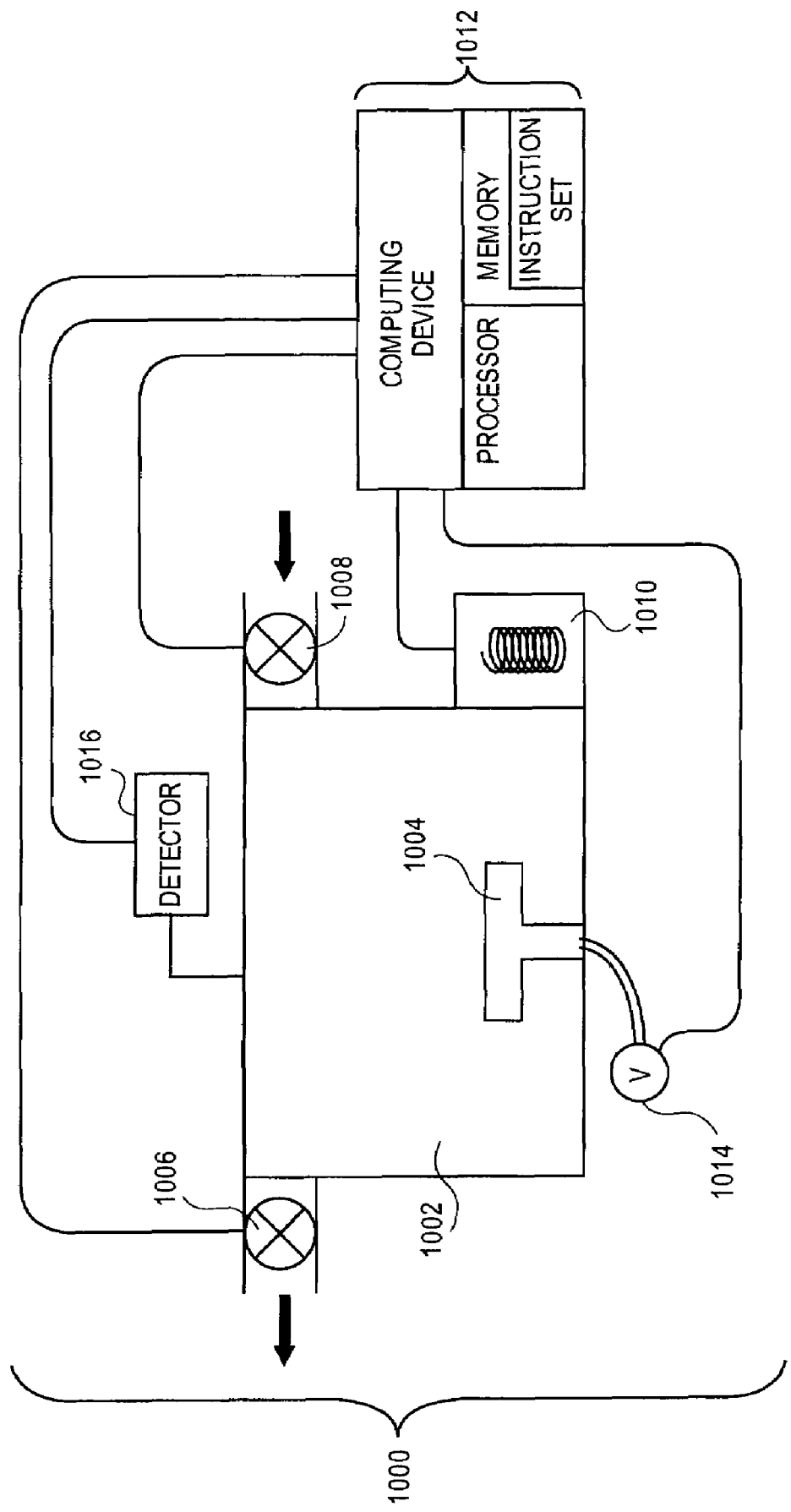
FIG. 10 illustrates a system in which a pulsed plasma process with pulsed sample bias is conducted, in accordance with an embodiment of the present invention.

A pulsed plasma etch process with pulsed sample bias may be conducted in any processing equipment suitable to provide an etch plasma in proximity to a sample for etching. FIG. 10 illustrates a system in which a pulsed plasma etch process with pulsed sample bias is conducted, in accordance with an embodiment of the present invention.

Referring to FIG. 10, a system 1000 for conducting a pulsed plasma etch process comprises a chamber 1002 equipped with a sample holder 1004. An evacuation device 1006, a gas inlet device 1008 and a plasma ignition device 1010 are coupled with chamber 1002; A voltage source 1014 is coupled with sample holder 1004. A computing device 1012 is coupled with plasma ignition device 1010 and voltage source 1014. System 1000 may additionally include a detector 1016 coupled with chamber 1002. Computing device 1012 may also be coupled with evacuation device 1006, gas inlet device 1008 and detector 1016, as depicted in FIG. 10.

Chamber 1002 and sample holder 1004 may be comprised of any reaction chamber and sample positioning device suitable to contain an ionized gas, i.e. a plasma, and bring a sample in proximity to the ionized gas or charged species ejected therefrom. Evacuation device 1006 may be any device suitable to evacuate and de-pressurize chamber 1002. Gas inlet device 1008 may be any device suitable to inject a reaction gas into chamber 1002. Plasma ignition device 1010 may be any device suitable for igniting a plasma derived from the reaction gas injected into chamber 1002 by gas inlet device 1008. Detection device 1016 may be any device suitable to detect an end-point of a processing step. In one embodiment, system 1000 comprises a chamber 1002, a sample holder 1004, an evacuation device 1006, a gas inlet device 1008, a plasma ignition device 1010 and a detector 1016 similar to, or the same as, those included in an Applied Materials™ AdvantEdge G3 etcher.

Computing device 1012 comprises a processor and a memory. In accordance with an embodiment of the present invention, the memory of computing device 1012 includes a set of instructions for controlling plasma ignition device 1010 to switch between an ON state and an OFF state of a plasma in a pulsed plasma etch process with pulsed sample bias. In an embodiment, the set of instructions contains machine operable code capable of effecting a plurality of duty cycles, wherein each duty cycle represents the combination of one ON state and one OFF state of the plasma. The memory of computing device 1012 also includes a set of instructions for controlling voltage source 1014 to switch between a negative bias and a zero bias. The negative bias is applied to said sample holder 1004 during the ON state of the plasma, while the zero bias is applied to sample holder 1004 during the OFF state of the plasma. In a specific embodiment, the set of instructions for controlling plasma ignition device 1010 includes timing instructions for each duty cycle to have an ON state in the range of 5-95% of the duration of the duty cycle. In an embodiment, the set of instructions for controlling plasma ignition device 1010 includes timing instructions for each duty cycle to have an ON state in the range of 65-75% of the duration of the duty cycle. In another embodiment, the set of instructions for controlling plasma ignition device 1010 includes timing instructions such that the frequency of a plurality of duty cycles is in the range of 1 Hz-200 kHz, i.e. each duty cycle has a duration in the range of 5 micro-seconds-1 second. In a specific embodiment, the set of instructions for controlling plasma ignition device 1010 includes timing instructions such that the frequency of a plurality of duty cycles is 50 kHz and the portion of each duty cycle comprised of said ON state is 70%. In an embodiment, the negative bias applied to sample holder 1004 by voltage source 1014 during the ON state of a duty cycle is in the range of 5-1000 Watts. In a specific embodiment, the negative bias applied to sample holder 1004 by voltage source 1014 during the ON state of a duty cycle is in the range of 100-200 Watts.

Figure 11A:
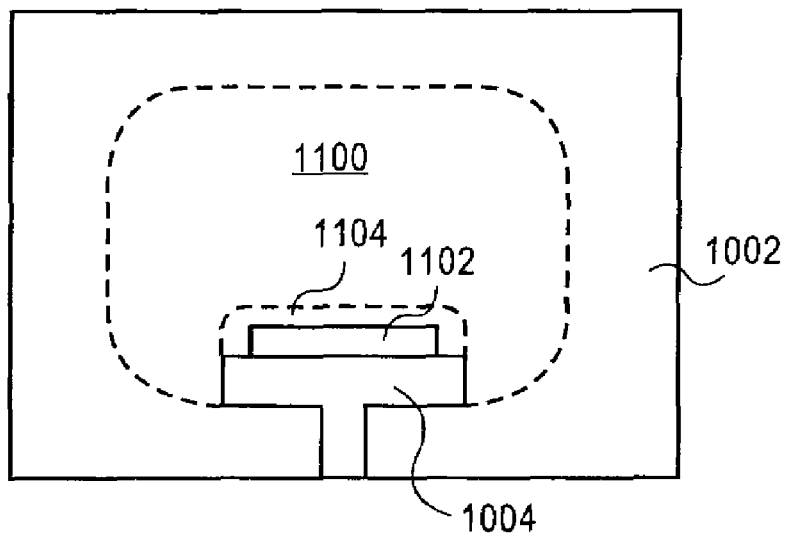
FIGS. 11A-B illustrate the chamber from the system of FIG. 10 in a plasma ON state and a plasma OFF state, respectively, in accordance with an embodiment of the present invention.
Figure 11B:
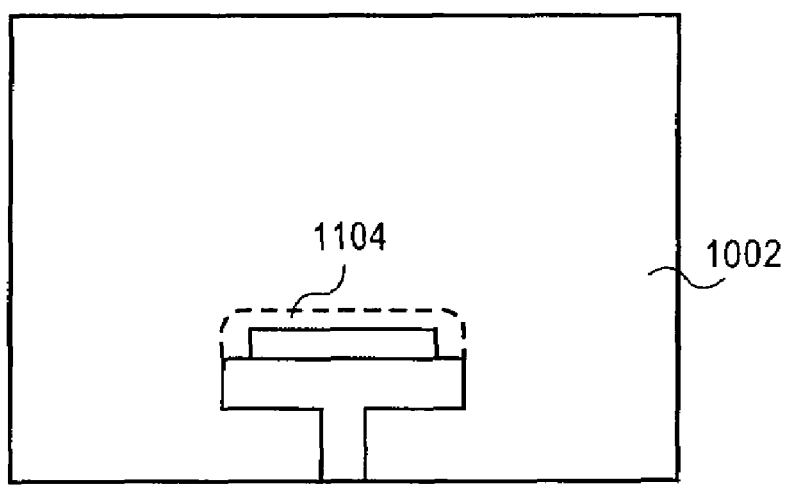

FIGS. 11A-B illustrate the chamber from the system of FIG. 10 in a plasma ON state and a plasma OFF state, respectively, in accordance with an embodiment of the present invention. Referring to FIG. 11A, chamber 1002 of system 1000 comprises a plasma 1100 in an ON state and in proximity to a sample 1102 on sample holder 1004. A reaction region 1104 is directly adjacent to sample 1102. During an etch process, etch by-products may be formed and reside, at least for a time, within reaction region 1102. Thus, in accordance with an embodiment of the present invention, the set of instructions for controlling plasma ignition device 1010 includes timing instructions such that the ON state is of a sufficiently short duration to substantially inhibit micro-loading within reaction region 1104. Referring to FIG. 11B, chamber 1002 of system 1000 comprises a plasma in an OFF state (i.e. a neutral reaction gas). In accordance with an embodiment of the present invention, the set of instructions for controlling plasma ignition device 1010 includes timing instructions such that the OFF state of a duty cycle in a pulsed plasma etch process is selected to be of a sufficiently long duration to substantially enable removal of a set of etch by-products from reaction region 1104.

During the ON state of a duty cycle in a pulsed plasma etch process, positive charge may be imparted to the sample being etched. In some instances, the positive charge of the sample may be substantial enough to partially deflect the positively charged etch species ejected from a plasma. Such deflection of the etching species may result in detrimental undercut of features being etched into a particular sample. By biasing the sample with a negative charge during the etching process, the deflection of positively charged particles may be mitigated. On the other hand, during the transition from the ON state to the OFF state of a duty cycle in a pulsed plasma etch process, the discharge of negatively-charged particles from the plasma may be inhibited if the sample is negatively biased. By zero-biasing the sample during the OFF state of a duty cycle, and thus not repelling negatively-charged particles emitted as the plasma discharges, a reduced time for plasma discharge may be achieved. Additionally, the negatively charged species may contribute to, and thus enhance, the etching process. Thus, in accordance with an embodiment of the present invention, a pulsed sample bias process is conducted parallel to the pulsed plasma process. That is, the sample is negatively biased during the ON state and is zero-biased during the OFF state of a duty cycle in a pulsed plasma etch process.

Figure 12A:
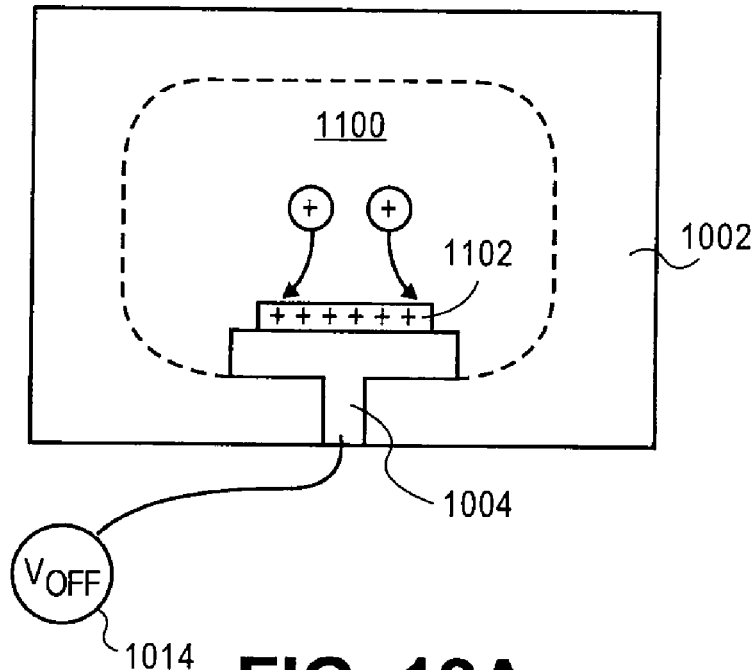
FIGS. 12A-D illustrate the chamber from the system of FIG. 10 in a plasma ON/bias OFF state, a plasma ON/bias ON state, a plasma OFF/bias ON state and a plasma OFF/bias OFF state respectively, in accordance with an embodiment of the present invention.
Figure 12B:
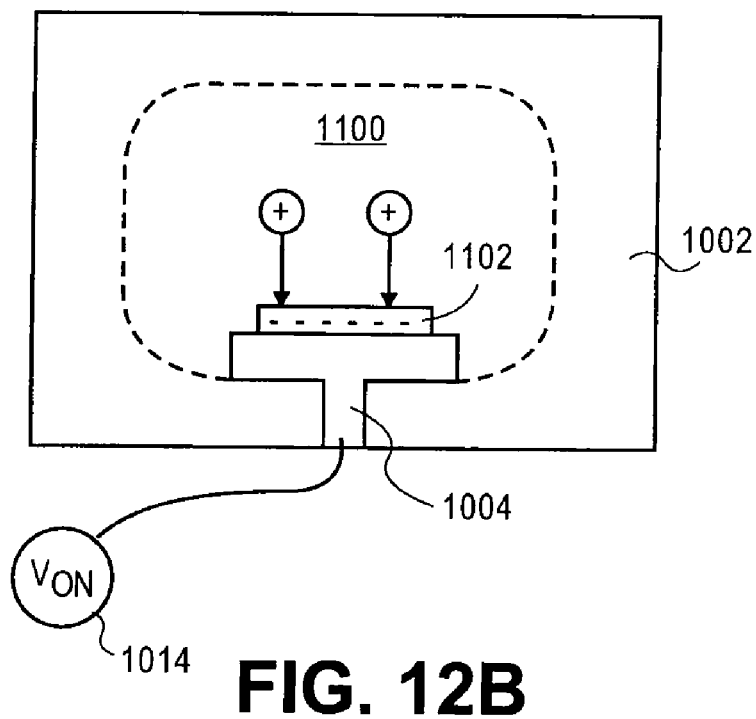

FIGS. 12A-D illustrate chamber 1002 from system 1000 of FIG. 10 in a plasma ON/bias OFF state, a plasma ON/bias ON state, a plasma OFF/bias ON state and a plasma OFF/bias OFF state, respectively, in accordance with an embodiment of the present invention. A voltage source 1014 is coupled with sample holder 1004 and is used to bias sample holder 1004, and hence sample 1102, during the ON state of a duty cycle. Referring to FIG. 12A, voltage source 1014 is in an OFF state and positively charged etch species ejected from plasma 1100 are partially deflected near the surface of sample 1102. However, referring to FIG. 12B, voltage source 1014 is in an ON state (i.e. negatively biasing sample holder 1004) and, thus, positively charged etch species ejected from plasma 1100 are held to an orthogonal trajectory (i.e. anisotropic trajectory) near the surface of sample 1102. In accordance with an embodiment of the present invention, voltage source 1014 is used to apply a negative bias to sample holder 1004 in the range of 5-1000 Watts during the ON state of a duty cycle. In a specific embodiment, voltage source 1014 is used to apply a negative bias to sample holder 1004 in the range of 100-200 Watts during the ON state of a duty cycle. A pulsed plasma etch process (as compared with a continuous plasma etch process) may reduce the extent of positive charge build-up on sample 1102 during an etch process. However, the additional step of biasing sample holder 1004 with voltage source 1014 may still be utilized as part of the pulsed plasma etch process in order to optimize the mitigation of undercutting of structures during the etch process. Therefore, in accordance with another embodiment of the present invention, the additional step of biasing sample holder 1004 with voltage source 1014 is used to extend the duration of the ON state of a duty cycle in a pulsed plasma etch process.

Figure 12C:
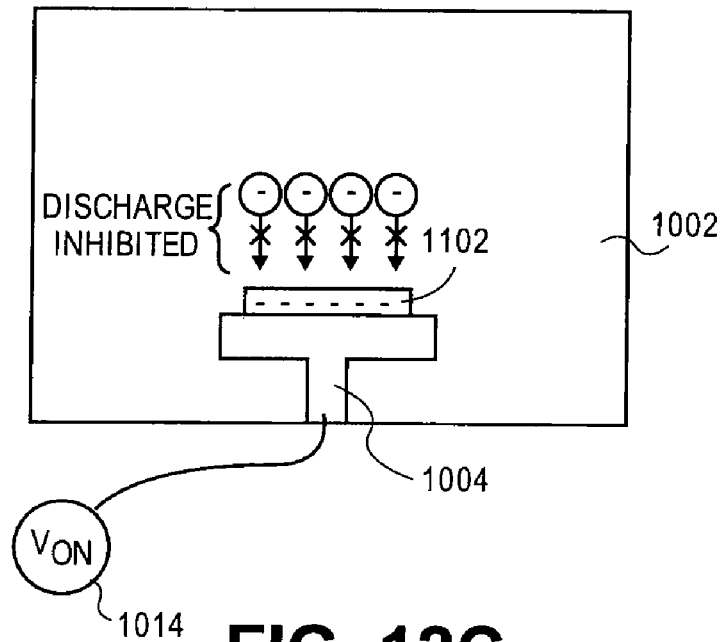
Figure 12D:
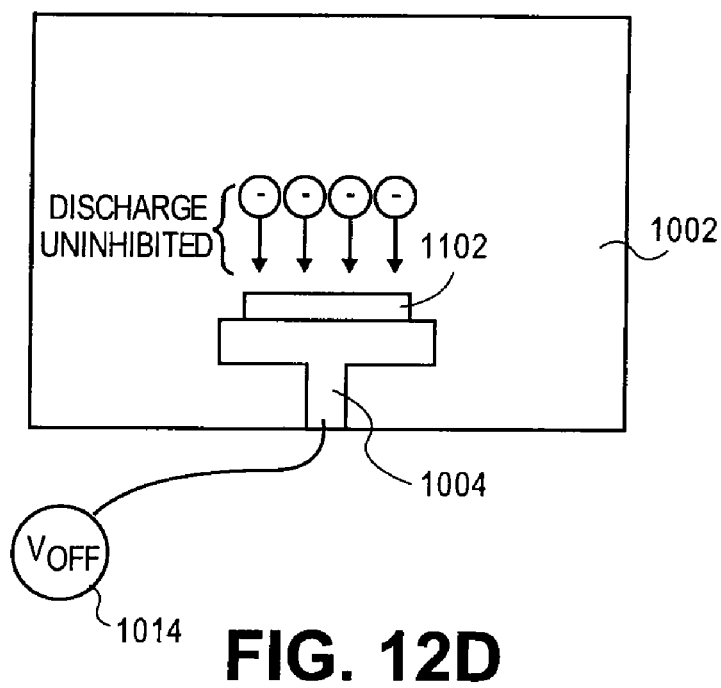

Referring to FIG. 12C, voltage source 1014 is in an ON state and negatively-charged particles ejected during the transition from plasma ON state to plasma OFF state are inhibited from approaching the surface of sample 1102, thus slowing the plasma OFF state step. However, referring to FIG. 12D, voltage source 1014 is in an OFF state (i.e. zero-biasing sample holder 1004) and, thus, negatively-charged particles ejected during the transition from plasma ON state to plasma OFF state are inhibited from approaching the surface of sample 1102. In accordance with an embodiment of the present invention, voltage source 1014 is turned off in order to apply a zero bias to sample holder 1004 during the OFF state of a duty cycle. Therefore, in accordance with an embodiment of the present invention, sample holder 1004 is negatively biased with voltage source 1004 to extend the duration of the ON state of a duty cycle in a pulsed plasma etch process, while sample holder 1004 is zero-biased with voltage source 1014 to reduce the duration of the OFF state of the duty cycle.

Thus, a pulsed plasma system with pulsed sample bias for etching semiconductor structures has been disclosed. In one embodiment, a portion of a sample is removed by applying a pulsed plasma etch process, wherein the pulsed plasma etch process comprises a plurality of duty cycles. A negative bias is applied to the sample during the ON state of each duty cycle, while a zero bias is applied to the sample during the OFF state of each duty cycle. In another embodiment, a first portion of a sample is removed by applying a continuous plasma etch process. The continuous plasma etch process is then terminated and a second portion of the sample is removed by applying a pulsed plasma etch process with pulsed sample bias. It is to be understood that the pulsed sample bias process need not be tied to the pulsed plasma process. Thus, in accordance with another embodiment of the present invention, the ON state of the pulsed plasma duty cycle and the ON state of the pulsed sample bias are independent from one another. In another embodiment, the OFF state of the pulsed plasma duty cycle and the OFF state of the pulsed sample bias are independent from one another.

What is claimed is:

1. A method for etching a sample on a sample holder, comprising:

providing said sample having a layer of a patterned photoresist above a first material layer, said first material layer above a second material layer, said second material layer having a composition different from said first material layer;

removing an exposed portion of said first material layer by applying a continuous plasma process;

terminating said continuous plasma process; and removing an exposed portion of said second material layer by applying a pulsed plasma process, wherein said pulsed plasma process comprises a plurality of duty cycles, each duty cycle representing the combination of an ON state and an OFF state of a plasma, wherein a negative bias is applied to said sample holder during said ON state, and wherein a zero bias is applied to said sample holder during said OFF state.

2. The method of claim 1 wherein the power of said negative bias is in the range of 5-1000 Watts.

3. The method of claim 1, further comprising:

removing an exposed portion of a third material layer, said third material layer below said second material layer, by applying a second continuous plasma process;

terminating said second continuous plasma process; and removing an exposed portion of a fourth material layer, said fourth material layer below said third material layer, by applying a second pulsed plasma process, wherein said second pulsed plasma process comprises a second plurality of duty cycles, each duty cycle representing the combination of a second ON state and a second OFF state of a second plasma, wherein a negative bias is applied to said sample holder during said second ON state, and wherein a zero bias is applied to said sample holder during said second OFF state.

4. The method of claim 1 wherein terminating said continuous etch process comprises detecting an end point.

5. The method of claim 4 wherein said end point is determined by the real-time composition of a set of chemical species generated during said continuous etch process.

6. The method of claim 4 wherein said end point is determined by the real-time film thickness measurement by interferometry.

7. The method of claim 1 wherein micro-loading is inhibited in a reaction region adjacent to said sample during said ON state, and wherein a set of etch by-products is removed from said reaction region during said OFF sate.

8. The method of claim 7 wherein the portion of each duty cycle comprised of said ON state is in the range of 5-95%.

9. The method of claim 8 wherein the duration of each duty cycle is in the range of 5-1000 micro-seconds.

* * * * *